United States Patent
Jiu et al.

(10) Patent No.: US 11,278,955 B2
(45) Date of Patent: Mar. 22, 2022

(54) ELECTRICALLY CONDUCTIVE PASTE, LAMINATED BODY, AND METHOD FOR BONDING CU SUBSTRATE OR CU ELECTRODE TO ELECTRICAL CONDUCTOR

(71) Applicant: SENJU METAL INDUSTRY CO., LTD., Tokyo (JP)

(72) Inventors: Jinting Jiu, Tokyo (JP); Yoshie Tachibana, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/312,834

(22) PCT Filed: Sep. 30, 2020

(86) PCT No.: PCT/JP2020/037142
§ 371 (c)(1),
(2) Date: Jun. 10, 2021

(87) PCT Pub. No.: WO2021/260960
PCT Pub. Date: Dec. 30, 2021

(65) Prior Publication Data
US 2022/0040758 A1    Feb. 10, 2022

(30) Foreign Application Priority Data
Jun. 24, 2020    (JP) ................. 2020-108622

(51) Int. Cl.
*B22F 3/10*    (2006.01)
*B22F 1/00*    (2022.01)
(Continued)

(52) U.S. Cl.
CPC .......... *B22F 1/0014* (2013.01); *B22F 1/0018* (2013.01); *B22F 1/0048* (2013.01);
(Continued)

(58) Field of Classification Search
None
See application file for complete search history.

(56) References Cited

U.S. PATENT DOCUMENTS

| 2012/0119153 A1* | 5/2012 | Choi | H01L 31/022425 |
| | | | 252/500 |
| 2014/0126113 A1* | 5/2014 | Ogiwara | H01B 1/22 |
| | | | 361/523 |
| 2021/0024766 A1* | 1/2021 | Chou | H01L 23/49883 |

FOREIGN PATENT DOCUMENTS

CN    107221373 A  *  9/2017
EP    3806111 A1      4/2021
(Continued)

OTHER PUBLICATIONS

Decision to Grant a Patent issued in JP-2020-108622 (granted as Patent No. JP-6778389), dated Sep. 9, 2020 (with English Translation) (6 pages).

(Continued)

*Primary Examiner* — Seth Dumbris
(74) *Attorney, Agent, or Firm* — Harness, Dickey & Pierce, P.L.C.

(57)    ABSTRACT

An object of the present invention is to provide an electrically conductive paste having excellent bonding strength when bonded to an electronic substrate and the like, a laminated body, and a method for bonding a Cu substrate or Cu electrode to an electrical conductor.
An electrically conductive paste comprising:
a flake-like silver powder A having a particle size in the range of 1 μm or more and 15 μm or less and having a median diameter D50 of 2 μm or more and 5 μm or less;
a silver powder B having a particle size in the range of 25 μm or more and 100 μm or less and having a median diameter D50 of 30 μm or more and 40 μm or less;

(Continued)

a silver powder C having a particle size in the range of 10 nm or more and 190 nm or less and having a median diameter D50 of 50 nm or more and 150 nm or less; and a solvent, wherein the content of the silver powder C is more than 5.0 parts by mass and less than 90.0 parts by mass based on 100 parts by mass in total of the flake-like silver powder A, the silver powder B, and the silver powder C.

12 Claims, 8 Drawing Sheets

(51) Int. Cl.
    *B32B 15/01*     (2006.01)
    *B32B 15/20*     (2006.01)
    *H01B 1/22*     (2006.01)
    *B22F 7/06*     (2006.01)

(52) U.S. Cl.
    CPC ............ *B22F 1/0055* (2013.01); *B22F 7/064* (2013.01); *B32B 15/01* (2013.01); *B32B 15/20* (2013.01); *H01B 1/22* (2013.01); *B22F 2301/10* (2013.01); *B22F 2304/054* (2013.01); *B22F 2304/056* (2013.01); *B22F 2304/10* (2013.01); *B32B 2457/00* (2013.01); *Y10T 428/12014* (2015.01)

(56) References Cited

FOREIGN PATENT DOCUMENTS

| | | |
|---|---|---|
| JP | H07-302510 A | 11/1995 |
| JP | 2004-362950 A | 12/2004 |
| JP | 2012028250 A * | 2/2012 |
| WO | WO-2020/008689 A1 | 1/2020 |

OTHER PUBLICATIONS

International Search Report and Written Opinion of the International Searching Authority issued in PCT/JP2020/037142, dated Oct. 27, 2020 (in Japanese); ISA/JP (9 pages).

* cited by examiner

ELECTRICALLY CONDUCTIVE PASTE, LAMINATED BODY, AND METHOD FOR BONDING CU SUBSTRATE OR CU ELECTRODE TO ELECTRICAL CONDUCTOR

CROSS REFERENCE TO RELATED APPLICATIONS

This application is a U.S. National Phase Application under 35 U.S.C. 371 of International Application No. PCT/JP2020/037142 filed on Sep. 30, 2020, which claims the benefit of priority from Japanese Patent Application No. 2020-108622 filed on Jun. 24, 2020. The entire disclosures of all of the above applications are incorporated herein by reference.

TECHNICAL FIELD

The present invention relates to an electrically conductive paste, a laminated body, and a method for bonding a Cu substrate or Cu electrode to an electrical conductor.

BACKGROUND ART

Conventionally, an electrically conductive paste using a metal powder of µm size (hereinafter sometimes referred to as "micron size") or nm size (hereinafter sometimes referred to as "nano size") has been widely used as an electrically conductive material. The electrically conductive paste using such micron-sized or nano-sized metal powder is used, for example, for forming an electronic circuit such as an electrode and wiring in a printed wiring board, or for bonding between an electronic substrate and an electronic component.

As a substrate to which the above electrically conductive paste is applied, a Cu (copper) substrate plated with Ag (silver) may be used. As for the electrodes provided on the electronic substrate, Cu electrodes plated with Ag are currently the mainstream. However, in recent years, in order to reduce costs and shorten the manufacturing process, Cu substrates or Cu electrodes without a plating layer, which are manufactured without a plating process, are increasingly used.

When bonding a Cu substrate or Cu electrode without such a plating layer to other components such as electronic components using electrically conductive paste, if the electrically conductive paste is applied directly to the surface of the Cu substrate or Cu electrode and the electrically conductive paste is sintered in air atmosphere, the Cu is oxidized on the surface of the Cu substrate or Cu electrode, forming a layer of copper oxide. When a copper oxide layer is formed on the surface of the Cu substrate or Cu electrode in this way, sufficient bonding at the interface between the Cu substrate or Cu electrode and the sintered body of the electrically conductive paste cannot be obtained. In such a case, in order to prevent the formation of a copper oxide layer on the surface of the Cu substrate or Cu electrode, the electrically conductive paste is sintered in nitrogen atmosphere instead of air atmosphere.

As an electrically conductive paste using a metal powder, in Patent Document 1 by the same applicant as the present application, an electrically conductive paste containing a flake-like silver powder having a median diameter D50 of 15 µm or less, a silver powder having a median diameter D50 of 25 µm or more, and a solvent, and an electrically conductive paste containing a flake-like silver powder having a median diameter D50 of 15 µm or less, a silver powder having a median diameter D50 of 25 µm or more, a silver powder with a bimodal particle size distribution having peaks at 0.1 µm to 0.5 µm and 1 to 15 µm, and a solvent have been proposed. However, as described later in Comparative Example 13 of the present application, when bonding the copper substrate without a plating layer to the electronic components (Si chips) by means of an electrically conductive paste, it was found that the above electrically conductive paste, as described in Patent Document 1, does not provide sufficient bonding strength between the copper substrate and the electronic components if the electrically conductive paste is applied directly to the surface of the copper substrate and the electrically conductive paste is sintered in nitrogen atmosphere.

CITATION LIST

Patent Literature

PTL 1: International Publication No. WO 2020/008689

As described above, there is a problem that the conventional electrically conductive pastes do not have sufficient bonding strength when bonding the Cu substrate or Cu electrode without a plating layer to other components such as electronic components by means of an electrically conductive paste, and when the electrically conductive paste is applied directly to the surface of the Cu substrate or Cu electrode and the electrically conductive paste is sintered in nitrogen atmosphere.

Therefore, there is a demand for an electrically conductive paste that solves the above problems and has excellent bonding strength when a Cu substrate or Cu electrode is bonded to other components such as electronic components.

SUMMARY OF INVENTION

Technical Problem

An object of the present invention is to provide an electrically conductive paste having excellent bonding strength when a Cu substrate or Cu electrode is bonded to other components such as electronic components, a laminated body, and a method for bonding a Cu substrate or Cu electrode to an electrical conductor.

Solution to Problem

As a result of intensive studies to solve the above problems, the inventors have found that the above problems can be solved by optimizing the combination of a plurality of silver powders having different particle size ranges and median diameters D50, and the present invention has been completed.

Specific embodiments of the present invention are as follows.

In the present application, when a numerical range is expressed using "X to Y", the range includes X and Y which are numerical values at both ends.

[1] An electrically conductive paste comprising:
a flake-like silver powder A having a particle size in the range of 1 µm or more and 15 µm or less and having a median diameter D50 of 2 µm or more and 5 µm or less,
a silver powder B having a particle size in the range of 25 µm or more and 100 µm or less and having a median diameter D50 of 30 µm or more and 40 µm or less, a silver powder C having a particle size in the range of 10 nm or more and 190 nm or less and having a median diameter D50 of 50 nm or more and 150 nm or less, and a solvent, wherein the content of the silver powder C is more than 5.0 parts by mass and less than 90.0 parts by mass based on 100 parts by mass in total of the flake-like silver powder A, the silver powder B, and the silver powder C.

[2] An electrically conductive paste comprising:

a flake-like silver powder A having a particle size in the range of 1 μm or more and 15 μm or less and having a median diameter D50 of 2 μm or more and 5 μm or less, a spherical silver powder D having a bimodal particle size distribution with a peak having a particle size in the range of 200 nm or more and 800 nm or less and having a median diameter D50 of 300 nm or more and 600 nm or less, and a peak having a particle size in the range of 1 μm or more and 15 μm or less and having a median diameter D50 of 1.5 μm or more and 4 μm or less, a silver powder C having a particle size in the range of 10 nm or more and 190 nm or less and having a median diameter D50 of 50 nm or more and 150 nm or less, and a solvent, wherein the content of the silver powder C is more than 5.0 parts by mass and less than 90.0 parts by mass based on 100 parts by mass in total of the flake-like silver powder A, the spherical silver powder D, and the silver powder C.

[3] An electrically conductive paste comprising:

a flake-like silver powder A having a particle size in the range of 1 μm or more and 15 μm or less and having a median diameter D50 of 2 μm or more and 5 μm or less, a silver powder B having a particle size in the range of 25 μm or more and 100 μm or less and having a median diameter D50 of 30 μm or more and 40 μm or less, a spherical silver powder D having a bimodal particle size distribution with a peak having a particle size in the range of 200 nm or more and 800 nm or less and having a median diameter D50 of 300 nm or more and 600 nm or less, and a peak having a particle size in the range of 1 μm or more and 15 μm or less and having a median diameter D50 of 1.5 μm or more and 4 μm or less, a silver powder C having a particle size in the range of 10 nm or more and 190 nm or less and having a median diameter D50 of 50 nm or more and 150 nm or less, and a solvent, wherein the content of the silver powder C is more than 5.0 parts by mass and less than 90.0 parts by mass based on 100 parts by mass in total of the flake-like silver powder A, the silver powder B, the spherical silver powder D, and the silver powder C.

[4] The electrically conductive paste according to [1], wherein the content of the silver powder C is 20.0 parts by mass or more and 65.0 parts by mass or less based on 100 parts by mass in total of the flake-like silver powder A, the silver powder B, and the silver powder C.

[5] The electrically conductive paste according to [2], wherein the content of the silver powder C is 25.0 parts by mass or more and 65.0 parts by mass or less based on 100 parts by mass in total of the flake-like silver powder A, the spherical silver powder D, and the silver powder C.

[6] The electrically conductive paste according to [3], wherein the content of the silver powder C is 20.0 parts by mass or more and 65.0 parts by mass or less based on 100 parts by mass in total of the flake-like silver powder A, the silver powder B, the spherical silver powder D, and the silver powder C.

[7] A laminated body comprising a Cu substrate or Cu electrode, the electrically conductive paste according to any one of [1] to [6], and an electrical conductor.

[8] A method for bonding a Cu substrate or Cu electrode to an electrical conductor, comprising:

a step of applying the electrically conductive paste according to any one of [1] to [6] to a Cu substrate or Cu electrode, a step of laminating an electrical conductor on the electrically conductive paste on the Cu substrate or Cu electrode to form a laminated body comprising the Cu substrate or Cu electrode, the electrically conductive paste, and the electrical conductor, and a step of sintering the electrically conductive paste by heating the laminated body at a temperature of 150 to 350° C. for a period of 1 minute or more and less than 100 minutes.

In the conventional conductive silver paste, sintering does not proceed sufficiently in nitrogen atmosphere, and sufficient bonding at the interface between the Cu substrate or Cu electrode and the sintered body of the electrically conductive paste may not be obtained. This is thought to be because when sintering is performed in nitrogen atmosphere, the metal powders in the electrically conductive paste are not sufficiently fused with each other and more gaps remain between the metal powders compared with in sintering in air atmosphere.

Although not bound by theory, it is presumed that silver powder C having a particle size of 10 nm or more and 190 nm or less and a median diameter D50 of 50 nm or more and 150 nm or less contained in the electrically conductive paste of the present invention can fill the gaps between a plurality of other silver powders and between other silver powders and the substrate or electrode to be bonded because of its small particle size. Therefore, it is presumed that the electrically conductive paste of the present invention can fill the above gap, and sufficient bonding with the Cu substrate or Cu electrode can be obtained even when sintering is performed in nitrogen atmosphere or when a Cu substrate or Cu electrode having no plating layer is used.

Advantageous Effects of Invention

The electrically conductive paste of the present invention is excellent in bonding strength when a Cu substrate or Cu electrode is bonded to other components such as electronic components.

DESCRIPTION OF EMBODIMENTS

Figure 1:
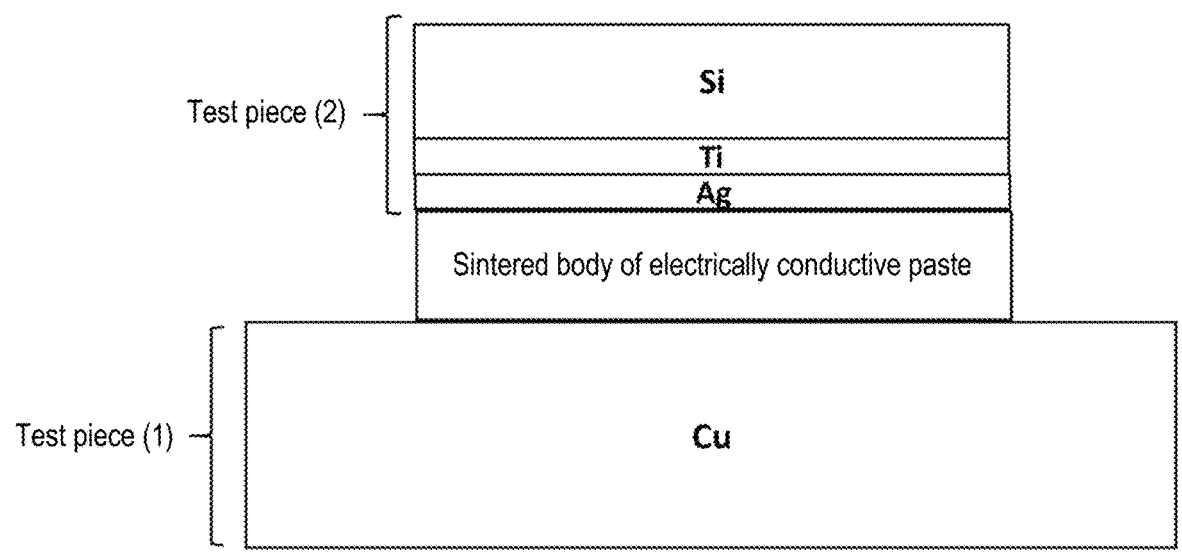
FIG. 1 is a schematic diagram of the sample used for evaluation of the shear strength in Examples.

Hereinafter, the electrically conductive paste, the laminated body, and the method for bonding the Cu substrate or Cu electrode to the electrical conductor in the present invention will be described.

First Embodiment (Electrically Conductive Paste)

The electrically conductive paste of the first embodiment comprises flake-like silver powder A having a particle size in the range of 1 µm or more and 15 µm or less and having a median diameter D50 of 2 µm or more and 5 µm or less, silver powder B having a particle size in the range of 25 µm or more and 100 µm or less and having a median diameter D50 of 30 µm or more and 40 µm or less, silver powder C having a particle size in the range of 10 nm or more and 190 nm or less and having a median diameter D50 of 50 nm or more and 150 nm or less, and a solvent, wherein the content of the silver powder C is more than 5.0 parts by mass and less than 90.0 parts by mass based on 100 parts by mass in total of the flake-like silver powder A, the silver powder B, and the silver powder C.

The electrically conductive paste of the first embodiment contains flake-like silver powder A, silver powder B, and silver powder C, and the content of silver powder C is within a specific range, which results in excellent bonding strength when the Cu substrate or Cu electrode is bonded to other components such as electronic components.

A metal component contained in the electrically conductive paste of the first embodiment may consist of flake-like silver powder A, silver powder B, and silver powder C, or may further contain other metal components.

The particle size range of flake-like silver powder A is 1 µm or more and 15 µm or less, preferably 1 µm or more and 10 µm or less, and more preferably 2 µm or more and 8 µm or less.

The median diameter D50 of flake-like silver powder A is 2 µm or more and 5 µm or less, preferably 2.5 µm or more and 4.5 µm or less, and more preferably 2.5 µm or more and 3.5 µm or less.

When the particle size range and the median diameter D50 of flake-like silver powder A are within the above numerical ranges, the electrically conductive paste can be adjusted to an appropriate viscosity, and the filling density of the silver powder in the electrically conductive paste can be increased.

In the present invention, flake-like silver powder A may be any silver powder that is acknowledged to be flake-like (flake-shaped or flaky) when observed by SEM. The SEM magnification can be appropriately set to 5000 times, 10000 times, etc. so that the shape of flake-like silver powder A with the particle size in the range of 1 µm or more and 15 µm or less and having a median diameter D50 of 2 µm or more and 5 µm or less can be seen. Here, the flake-like (flake-shaped or flaky) particles mean particles having an aspect ratio (ratio of longest long diameter/shortest short diameter) of 5 to 300.

Since the electrically conductive paste of the present invention contains not only spherical silver powder but also flake-like silver powder A, flake-like silver particles are filled in voids formed between adjacent spherical powders, and continuous contacts between silver powders are formed, and therefore, the conductivity can be improved. Further, the dispersion of each silver powder in the electrically conductive paste can be made uniform.

The particle size range of silver powder B is 25 µm or more and 100 µm or less, preferably 25 µm or more and 80 µm or less, and more preferably 25 µm or more and 70 µm or less.

The median diameter D50 of silver powder B is 30 µm or more and 40 µm or less, preferably 30 µm or more and 38 µm or less, and more preferably 33 µm or more and 37 µm or less.

When the particle size range and the median diameter D50 of silver powder B are within the above numerical ranges, the filling density of the silver powder in the electrically conductive paste can be increased, the thickness when the electrically conductive paste is applied to the Cu substrate or Cu electrode can be maintained within a sufficient range, and the thermal and electrical characteristics of the joint between the Cu substrate or Cu electrode and the electrical conductor can be improved.

The shape of silver powder B can be confirmed by observing with SEM. The magnification of the SEM can be appropriately set to 5000 times, 10000 times, etc. so that the shape of silver powder B having a particle size in the range of 25 µm or more and 100 µm or less and having a median diameter D50 of 30 µm or more and 40 µm or less can be seen. The shape of silver powder B is not particularly limited, and may be either spherical or non-spherical. Examples of the non-spherical shapes include flake-like, needle-like, horn-like, dendritic, granular, irregular-shaped, teardrop-like, plate-like, very thin plate-like, hexagonal plate-like, column-like, rod-like, porous, fibrous, lump-like, sponge-like, angular, round shapes, or a combination thereof. Among these shapes, the spherical shape, column-like shape, or a combination thereof is preferable.

The particle size range of silver powder C is 10 nm or more and 190 nm or less, preferably 10 nm or more and 150 nm or less, and more preferably 30 nm or more and 120 nm or less.

The median diameter D50 of silver powder C is 50 nm or more and 150 nm or less, preferably 60 nm or more and 130 nm or less, and more preferably 70 nm or more and 120 nm or less.

The shape of silver powder C can be confirmed by observing with SEM. The magnification of the SEM can be appropriately set to 5000 times or 10000 times, etc. so that the shape of silver powder C having a particle size in the range of 10 nm or more and 190 nm or less and a median diameter D50 of 50 nm or more and 150 nm or less can be seen. The shape of silver powder C is not particularly limited, and examples thereof include a spherical shape, a non-spherical shape (for example, flake-like, needle-like, square-like, plate-like, etc.), or a combination thereof. Among these shapes, a spherical shape, a flake-like shape, a needle-like shape, a plate-like shape, or a combination thereof is preferable.

The content of silver powder C is more than 5.0 parts by mass and less than 90.0 parts by mass, preferably 10.0 to 70.0 parts by mass, and more preferably 20.0 to 65.0 parts by mass, based on 100 parts by mass in total of flake-like silver powder A, silver powder B, and silver powder C.

When the particle size range, median diameter D50, and content of silver powder C are within the above numerical ranges, the viscosity of the electrically conductive paste and the filling density of silver powder can be adjusted to an appropriate level, the electrically conductive paste can be sufficiently sintered even at a low temperature, and the thermal characteristics and electrical characteristics of the joint between the Cu substrate or Cu electrode and the electrical conductor can be improved.

In addition, by setting the content of silver powder C to 20.0 parts by mass or more and 65.0 parts by mass or less based on 100 parts by mass in total of flake-like silver powder A, silver powder B, and silver powder C, it is possible to improve the bonding strength when a substrate or electrode is bonded to other components such as electronic components.

The content of flake-like silver powder A is not particularly limited, and is preferably 3 to 83 parts by mass, more preferably 10 to 70 parts by mass, and most preferably 20 to 60 parts by mass based on 100 parts by mass in total of flake-like silver powder A, silver powder B, and silver powder C.

The content of silver powder B is not particularly limited, and is preferably 3 to 83 parts by mass, more preferably 10 to 75 parts by mass, and most preferably 15 to 60 parts by mass based on 100 parts by mass in total of flake-like silver powder A, silver powder B, and silver powder C.

The total content of flake-like silver powder A, silver powder B, and silver powder C based on 100 parts by mass of the electrically conductive paste is preferably 40 to 98 parts by mass, more preferably 60 to 95 parts by mass, and most preferably 80 to 95 parts by mass.

Examples of the solvent contained in the electrically conductive paste include water, an alcohol-type solvent, a glycol ether-type solvent, terpineols, and mixtures thereof.

Examples of the alcohol-type solvent include isopropyl alcohol, 1,2-butanediol, isobornylcyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethyl)ethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethyl)ethyl]ether, 1-ethynyl-1-cyclohexanol, 1,4-cyclohexanediol, 1,4-cyclohexanedimethanol, erythritol, threitol, guaiacol glycerol ether, 3,6-dimethyl-4-octyne-3,6-diol, 2,4,7,9-tetramethyl-5-decyne-4,7-diol, or a mixture thereof. Among these, ethylene glycol or ethanol is preferable, and ethylene glycol is more preferable, from the viewpoint of printability and wettability of the paste.

Examples of the glycol ether-type solvent include diethylene glycol mono-2-ethylhexyl ether, ethylene glycol monophenyl ether, 2-methylpentane-2,4-diol, diethylene glycol monohexyl ether, diethylene glycol dibutyl ether, triethylene glycol monobutyl ether, or a mixture thereof.

Examples of terpineols include cayupte oil, pine oil, petitgrain oil, or a mixture thereof.

The content of the solvent based on 100 parts by mass of the electrically conductive paste is preferably 5 to 30 parts by mass, more preferably 5 to 15 parts by mass, and most preferably 5 to 10 parts by mass. When the content of the solvent is within the above numerical range, the viscosity can be adjusted to an appropriate level that improves the coatability (printability) of the electrically conductive paste.

Second Embodiment (Electrically Conductive Paste)

The electrically conductive paste of the second embodiment comprises flake-like silver powder A having a particle size in the range of 1 μm or more and 15 μm or less and having a median diameter D50 of 2 μm or more and 5 μm or less, spherical silver powder D having a bimodal particle size distribution with a peak (first peak) having a particle size in the range of 200 nm or more and 800 nm or less and having a median diameter D50 of 300 nm or more and 600 nm or less and a peak (second peak) having a particle size in the range of 1 μm or more and 15 μm or less and having a median diameter D50 of 1.5 μm or more and 4 μm or less, silver powder C having a particle size in the range of 10 nm or more and 190 nm or less and having a median diameter D50 of 50 nm or more and 150 nm or less, and a solvent, wherein the content of the silver powder C is more than 5.0 parts by mass and less than 90.0 parts by mass based on 100 parts by mass in total of the silver powder A, the spherical silver powder D, and silver powder C.

The electrically conductive paste of the second embodiment contains flake-like silver powder A, spherical silver powder D, and silver powder C, and the content of silver powder C is within a specific range, which results in excellent bonding strength when the Cu substrate or Cu electrode is bonded to other components such as electronic components.

A metal component contained in the electrically conductive paste of the second embodiment may consist of flake-like silver powder A, spherical silver powder D, and silver powder C, or may further contain other metal components.

The particle size range, median diameter D50, and the definition of the flake shape of flake-like silver powder A, the particle size range, median diameter D50, and shape of silver powder C, and the type and content of solvent can be the same as those shown in the first embodiment described above.

The particle size range of the first peak of spherical silver powder D is 200 nm or more and 800 nm or less, preferably 200 nm or more and 700 nm or less, and more preferably 300 nm or more and 500 nm or less. The particle size range of the second peak of spherical silver powder D is 1 μm or more and 15 μm or less, preferably 1.5 μm or more and 10 μm or less, and more preferably 2 μm or more and 8 μm or less.

The median diameter D50 of the first peak of spherical silver powder D is 300 nm or more and 600 nm or less, preferably 300 nm or more and 500 nm or less, and more preferably 350 nm or more and 450 nm or less. The median diameter D50 of the second peak of spherical silver powder D is 1.5 μm or more and 4 μm or less, preferably 1.5 μm or more and 3.5 μm or less, and more preferably 2 μm or more and 3 μm or less.

When the particle size range and the median diameter D50 of the first peak and the second peak of spherical silver powder D are within the above numerical ranges, the viscosity of the electrically conductive paste and the filling density of the silver powder can be adjusted to an appropriate level, the electrically conductive paste can be sufficiently sintered, and the thermal characteristics and electrical characteristics of the joint between the Cu substrate or Cu electrode and the electrical conductor can be improved.

The content of the first peak based on spherical silver powder D: 100 parts by mass is preferably 5 to 50 parts by mass, more preferably 10 to 30 parts by mass, and most preferably 15 to 25 parts by mass. The content of the second peak based on spherical silver powder D: 100 parts by mass is preferably 50 to 95 parts by mass, more preferably 70 to 90 parts by mass, and most preferably 75 to 85 parts by mass.

When the contents of the first peak and the second peak are within the above numerical ranges, the filling density of the silver powder in the electrically conductive paste can be increased, and a denser structure can be formed when the sintered body is made.

The shape of spherical silver powder D can be confirmed by observing with SEM. The magnification of the SEM can be appropriately set to 5000 times, 10000 times, etc. so that the shape of spherical silver powder D can be seen. The shape of spherical silver powder D is not limited to a true spherical shape, and the aspect ratio (ratio of long diameter/short diameter) may be 1.0 to 1.3.

The content of silver powder C is more than 5.0 parts by mass and less than 90.0 parts by mass, preferably more than 10.0 parts by mass and less than 80.0 parts by mass, more preferably 20.0 to 70.0 parts by mass, and most preferably 25.0 to 60.0 parts by mass based on 100 parts by mass in total of flake-like silver powder A, spherical silver powder D, and silver powder C.

When the content of silver powder C is within the above numerical range, the viscosity of the electrically conductive paste and the filling density of the silver powder can be adjusted to appropriate levels, the electrically conductive paste can be sufficiently sintered even at a low temperature, and the thermal and electrical characteristics of the joint between the Cu substrate or Cu electrode and the electrical conductor can be improved.

In addition, by setting the content of silver powder C to 25.0 parts by mass or more and 65.0 parts by mass or less based on 100 parts by mass in total of flake-like silver powder A, spherical silver powder D, and silver powder C, it is possible to improve the bonding strength when bonding a substrate or electrode to other components such as electronic components.

The content of flake-like silver powder A is not particularly limited, and is preferably 3 to 78 parts by mass, more preferably 10 to 65 parts by mass, and most preferably 20 to 55 parts by mass based on 100 parts by mass in total of flake-like silver powder A, spherical silver powder D, and silver powder C.

The content of spherical silver powder D is not particularly limited, and is preferably 3 to 78 parts by mass, more preferably 10 to 65 parts by mass, and most preferably 20 to 55 parts by mass based on 100 parts by mass in total of flake-like silver powder A, spherical silver powder D, and silver powder C.

The total content of flake-like silver powder A, spherical silver powder D, and silver powder C based on 100 parts by mass of the electrically conductive paste is preferably 40 to 98 parts by mass, more preferably 60 to 95 parts by mass, and most preferably 80 to 95 parts by mass.

Third Embodiment (Electrically Conductive Paste)

The electrically conductive paste of the third embodiment comprises flake-like silver powder A having a particle size in the range of 1 μm or more and 15 μm or less and having a median diameter D50 of 2 μm or more and 5 μm or less, silver powder B having a particle size in the range of 25 μm or more and 100 μm or less and having a median diameter D50 of 30 μm or more and 40 μm or less, spherical silver powder D having a bimodal particle size distribution with a peak (first peak) having a particle size in the range of 200 nm or more and 800 nm or less and having a median diameter D50 of 300 nm or more and 600 nm or less, and a peak (second peak) having a particle size in the range of 1 μm or more and 15 μm or less and having a median diameter D50 of 1.5 μm or more and 4 μm or less, and silver powder C having a particle size in the range of 10 nm or more and 190 nm or less and having a median diameter D50 of 50 nm or more and 150 nm or less and a solvent, wherein the content of the silver powder C is more than 5.0 parts by mass and less than 90.0 parts by mass based on 100 parts by mass in total of the flake-like silver powder A, the silver powder B, the spherical silver powder D, and the silver powder C.

The electrically conductive paste of the third embodiment contains flake-like silver powder A, silver powder B, spherical silver powder D, and silver powder C, and the content of silver powder C is within a specific range, which results in excellent bonding strength when bonding the Cu substrate or Cu electrode to other components such as electronic components.

A metal component contained in the electrically conductive paste of the third embodiment may consist of flake-like silver powder A, silver powder B, spherical silver powder D, and silver powder C, or may further contain other metal components.

The particle size range, median diameter D50, and the definition of flake shape of flake-like silver powder A, the particle size range, median diameter D50, and shape of silver powder B, the particle size range and median diameter D50 of first peak and second peak of spherical silver powder D, the spherical definition of spherical silver powder D, the content of first and second peaks based on spherical silver powder D: 100 parts by mass, the particle size range, median diameter D50, and shape of silver powder C, and the type and content of solvent can be the same as those shown in the first embodiment and/or the second embodiment.

The content of silver powder C is more than 5.0 parts by mass and less than 90.0 parts by mass, preferably 10.0 to 80.0 parts by mass, and more preferably 20.0 to 65.0 parts by mass based on 100 parts by mass in total of flake-like silver powder A, silver powder B, spherical silver powder D, and silver powder C.

When the content of silver powder C is within the above numerical range, the viscosity of the electrically conductive paste and the filling density of the silver powder can be adjusted to an appropriate level, the electrically conductive paste can be sufficiently sintered even at a low temperature, and the thermal and electrical characteristics of the joint between the Cu substrate or Cu electrode and the electrical conductor can be improved.

In addition, when the content of silver powder C is 20.0 parts by mass or more and 65.0 parts by mass or less based on 100 parts by mass in total of flake-like silver powder A, silver powder B, spherical silver powder D, and silver powder C, it is possible to improve the bonding strength when a substrate or electrode is bonded to other components such as electronic components.

The content of flake-like silver powder A is not particularly limited, and is preferably 3 to 80 parts by mass, more preferably 10 to 70 parts by mass, and most preferably 15 to 65 parts by mass based on 100 parts by mass in total of flake-like silver powder A, silver powder B, spherical silver powder D, and silver powder C.

The content of silver powder B is not particularly limited, and is preferably 3 to 80 parts by mass, more preferably 10 to 70 parts by mass, and most preferably 15 to 50 parts by mass based on 100 parts by mass in total of flake-like silver powder A, silver powder B, spherical silver powder D, and silver powder C.

The content of spherical silver powder D is not particularly limited, and is preferably 3 to 80 parts by mass, more preferably 10 to 70 parts by mass, and most preferably 20 to 60 parts by mass based on 100 parts by mass in total of flake-like silver powder A, silver powder B, spherical silver powder D, and silver powder C.

The total content of flake-like silver powder A, silver powder B, spherical silver powder D, and silver powder C based on 100 parts by mass of the electrically conductive paste is preferably 40 to 98 parts by mass, more preferably 60 to 95 parts by mass, and most preferably 80 to 95 parts by mass.

In the electrically conductive pastes of the first to third embodiments, the particle size range and median diameter D50 of each silver powder mean those measured by a laser diffraction method using SALD-2300 (manufactured by Shimadzu Corporation) under the following conditions.

(Measurement Conditions)

First, 0.1 g of silver powder is dissolved in 10 ml of ethanol, and then measurement is performed while dispersing with ultrasonic waves. The obtained measurement result is analyzed by software WingSALDII (manufactured by Shimadzu Corporation) to obtain a particle size range and a median diameter D50.

The electrically conductive pastes of the first to third embodiments can be made by kneading the above-mentioned silver powders and solvent using, for example, ARV-310 (manufactured by Shinky Co., Ltd.) apparatus.

The electrically conductive pastes of the first to third embodiments can be used for any of sintering in nitrogen atmosphere and sintering in air atmosphere. The electrically conductive pastes of the first to third embodiments can be directly applied to the Cu substrate or Cu electrode and sintered without a plating layer in order to bond the electrical conductor to the Cu substrate or Cu electrode. The atmospheric conditions for sintering may be any of vacuum state, nitrogen atmosphere, and air atmosphere. The electrically conductive pastes of the first to third embodiments can be used for bonding the Cu substrate or Cu electrode to the electrical conductor in nitrogen atmosphere without using a plating layer.

After applying (printing) the electrically conductive paste on the Cu substrate or on the Cu electrode provided on the Cu substrate, the electrically conductive paste can be sintered. Since the sintered body obtained by sintering the electrically conductive paste has conductivity, it functions as a wiring (electronic circuit) on a Cu substrate or Cu electrode, or an electrically conductive bonding portion (adhesive portion). The method of applying (printing) the electrically conductive paste is not particularly limited, and examples thereof include dispense coating, screen printing, spray coating, brush coating, injection, or a combination thereof.

The Cu substrate is not particularly limited, and examples thereof include a ceramic substrate such as DBC (Direct Bonded Copper) and a Cu lead frame. Other components such as electronic components can be mounted on the Cu substrate.

It is preferable to remove the copper oxide layer existing on the surface of the Cu substrate or Cu electrode by washing, polishing, or the like, before applying the above electrically conductive paste and sintering it. By removing the copper oxide layer existing on the surface of the Cu substrate or Cu electrode, a sufficient bonding between the Cu substrate or Cu electrode and the sintered body of the electrically conductive paste can be obtained. Although an Ag plating layer may be provided on the Cu substrate or Cu electrode, it is preferable not to provide a plating layer from the viewpoint of cost reduction and shortening of the manufacturing process.

The electrically conductive paste of the present invention does not require a plating layer, and sufficient bonding can be obtained at the interface between the Cu substrate or Cu electrode and the sintered body even if it is applied directly to the surface of the Cu substrate or Cu electrode where the layer of copper oxide on the surface has been removed and sintering is performed. Of course, the electrically conductive paste of the present invention can impart sufficient bonding to the Cu substrate or Cu electrode with the same or higher bonding strength even when applied to the Cu substrate or Cu electrode via the Ag plating layer. When the electrically conductive paste is applied to the Cu substrate or Cu electrode via the Ag plating layer and further sintered in air atmosphere, a layer of copper oxide is not formed on the surface of the Cu substrate or Cu electrode due to the presence of the plating layer, and sintering proceeds more easily than in nitrogen atmosphere, resulting in superior bonding strength at the interface between the Cu substrate or Cu electrode and the sintered body of the electrically conductive paste.

The atmospheric conditions for sintering the electrically conductive paste are not particularly limited, and nitrogen atmosphere, air atmosphere, vacuum, etc. can be adopted. Among these, it is preferable to perform the process in nitrogen atmosphere from the viewpoint of suppressing the formation of a layer of copper oxide due to oxidation of Cu and improving the bondability with the Cu substrate or Cu electrode.

The heating temperature for sintering the electrically conductive paste is not particularly limited, and is preferably 150 to 350° C., more preferably 180 to 300° C., and most preferably 200 to 300° C. from the viewpoint of obtaining a sintered body having a dense structure.

The heating time for sintering the electrically conductive paste is not particularly limited, and it is preferably 1 minute or more and less than 100 minutes, more preferably 5 minutes or more and less than 60 minutes, and most preferably 10 minutes or more and less than 45 minutes from the viewpoint of obtaining a sintered body having a dense structure.

The pressure conditions for sintering the electrically conductive paste are not particularly limited, and may be either a state in which no pressure is applied or a state in which pressure is applied.

The shape of the wiring or the bonding portion obtained by sintering the electrically conductive paste is not particularly limited, and examples thereof include a sheet shape, a film shape, a tape shape, a linear shape, a disk shape, a block shape, a spot shape, an irregular shape, or a combination thereof.

The electrical resistance value indicated by the wiring or bonding portion obtained by sintering the electrically conductive paste is preferably 8.5 μΩ·cm or less, more preferably 7.0 μΩ·cm or less, and most preferably 5.0 μΩ·cm or less. The electric resistance value of the sintered body can be measured by the method described in "(2) Evaluation of electric resistance value" of "1. Evaluation method" described later.

It can be a laminated body containing a Cu substrate or Cu electrode, an electrically conductive paste of any one of the first to third embodiments above, and an electrical conductor.

The electrical conductor can be bonded to the Cu substrate or Cu electrode by a method including a step of applying the electrically conductive paste of any one of the first to third embodiments to the Cu substrate or Cu electrode, a step of laminating an electrical conductor on the electrically conductive paste on the Cu substrate or Cu electrode to form a laminated body containing the Cu substrate or Cu electrode, the electrically conductive paste, and the electrical conductor, and a step of sintering the electrically conductive paste by heating the laminated body at a temperature of 150 to 350° C. for a period of 1 minute or more and less than 100 minutes.

The portion of the sintered body obtained by sintering the electrically conductive paste has conductivity and bonds the Cu substrate or Cu electrode to the electrical conductor, thus it functions as an electrically conductive bonding portion (adhesive portion). In addition, examples of the electrical conductor to be bonded include a chip component such as a capacitor and a resistor, and a chip formed by forming a semiconductor element such as a resistor, a transistor, a capacitor, and an integrated circuit on a wafer and then cutting out the section of each semiconductor element from the wafer, or a combination thereof.

The conditions (atmospheric condition, heating temperature, heating time, pressure condition, etc.) for sintering the electrically conductive paste in the method of bonding the Cu substrate or Cu electrode to the electrical conductor are not particularly limited, and the above-mentioned ones can be used.

The shear strength exhibited by the joint between the Cu substrate or Cu electrode and the electrical conductor is preferably 12.0 MPa or more, more preferably 15.0 MPa or more, more preferably 20.0 MPa or more, and most preferably 30.0 MPa or more. In the present invention, the shear strength means that measured by a method according to JIS Z 3198, and the bonding strength (shear strength) of the above laminated body after sintering can be measured by the method described in "(1) Evaluation of shear strength" of "1. Evaluation Method" described later.

Hereinafter, the present invention will be specifically described by way of Examples, but the present invention is not limited to the contents described in the Examples.

EXAMPLES

1. Evaluation Method
(1) Evaluation of Shear Strength
(1-1) Shear Strength of Examples 1 to 21 and Comparative Examples 1 to 23

The entire copper substrate (length×width dimensions: 50 mm×50 mm) was immersed in an ethanol solution containing 5% by weight hydrochloric acid, and left immersed for 5 minutes. The immersion-treated copper substrate was taken out from the ethanol solution and left at room temperature (25° C.) for 1 minute to remove the ethanol solution and dry it, resulting in a washed copper substrate (hereinafter referred to as test piece (1)). Test piece (1) thus obtained is in a state in which copper oxide on the surface has been removed. The electrically conductive paste was screen-printed directly on the surface of test piece (1) using a metal mask (thickness of 100 μm).

On the other hand, a Si chip (length×width dimensions: 3 mm×3 mm) (corresponding to an electronic component) (hereinafter referred to as test piece (2)) in which a Ti layer (thickness of 40 nm) and an Ag layer (thickness of 1000 nm) in order from the Si chip side were laminated by sputtering was prepared.

Then, using a chip mounter (product name SMT-64RH, manufactured by Okuhara Electric Co., Ltd.), the Ag layer side of test piece (2) was laminated on the electrically conductive paste applied to test piece (1) to obtain a sample containing test piece (1), the electrically conductive paste, and test piece (2). The obtained sample was heated at 250° C. for 60 minutes in nitrogen atmosphere and atmospheric pressure for sintering.

FIG. 1 shows a schematic diagram of the obtained sample after sintering.

Then, for the samples after sintering, the shear strength (MPa) between test piece (1) and test piece (2) was measured under the conditions of room temperature (25° C.) in accordance with JIS Z 3198 using a Nordson DAGE Series 4000 universal bond tester (manufactured by Noedon Corporation). Each sample was measured 8 times, and the average value of shear strength (MPa) was calculated.

It can be said that the bondability between the test pieces is good if the average value of the shear strength of the samples is 12.0 MPa or more. When the average value of the shear strength of the sample is 5.0 MPa or less, the test pieces are not sufficiently bonded to each other, and the measured values vary and there is no significant difference in the calculated average value as a numerical value. Therefore, it is expressed as 5.0 MPa or less instead of a specific value.

However, regarding Comparative Example 7 in which ethanol was used as the solvent, when the chip mounter was used, the solvent volatilized before test piece (2) was laminated on the electrically conductive paste, thus test piece (2) could not be bonded, and in addition, when the sintering was carried out in nitrogen atmosphere and atmospheric pressure, the solvent volatilized quickly, thus test piece (2) could not be bonded. Therefore, for Comparative Example 7, test piece (2) was manually and quickly laminated on the electrically conductive paste, and the pressure during sintering was set to 0.4 MPa, and other conditions were set in the same manner as above, and the samples after sintering were obtained and the shear strength was measured.

(1-2) Shear Strength of Examples 22 to 24

In Example 22, a sample after sintering was obtained in the same manner as in Examples 1 to 21 and Comparative Examples 1 to 23 above, except that instead of test piece (1), a copper substrate (length×width dimensions: 50 mm×50 mm) (hereinafter referred to as test piece (1')) in which a Ti layer (thickness of 40 nm) and an Ag layer (thickness of 1000 nm) (corresponding to a plating layer) in order from the copper substrate side were laminated by sputtering was used. The shear strength (MPa) between test piece (1') and test piece (2) in the sample was measured.

In Example 23, a sample after sintering was obtained in the same manner as in Examples 1 to 21 and Comparative Examples 1 to 23 above, except that air atmosphere was used instead of nitrogen atmosphere as the atmospheric conditions during sintering. The shear strength (MPa) between test piece (1) and test piece (2) in the sample was measured.

In Example 24, a sample after sintering was obtained in the same manner as in Examples 1 to 21 and Comparative Examples 1 to 23 above, except that the above test piece (1') was used instead of test piece (1), and air atmosphere was adopted instead of nitrogen atmosphere as the atmospheric conditions during sintering. The shear strength (MPa) between test piece (1') and test piece (2) in the sample was measured.

(1-3) Shear Strength of Examples 25 to 33

In Examples 25 to 27, a sample after sintering was obtained in the same manner as in Example 3 except that 200° C., 280° C., and 300° C., respectively, were adopted as the sintering temperatures instead of 250° C. The shear strength (MPa) between test piece (1) and test piece (2) in the sample was measured.

In Examples 28 to 30, a sample after sintering was obtained in the same manner as in Example 10 except that 200° C., 280° C., and 300° C., respectively, were adopted as the sintering temperatures instead of 250° C. The shear strength (MPa) between test piece (1) and test piece (2) in the sample was measured.

In Examples 31 to 33, a sample after sintering was obtained in the same manner as in Example 17 except that 200° C., 280° C., and 300° C., respectively, were adopted as the sintering temperatures instead of 250° C. The shear strength (MPa) between test piece (1) and test piece (2) in the sample was measured.

(2) Evaluation of Electrical Resistance Value

Figure 2:
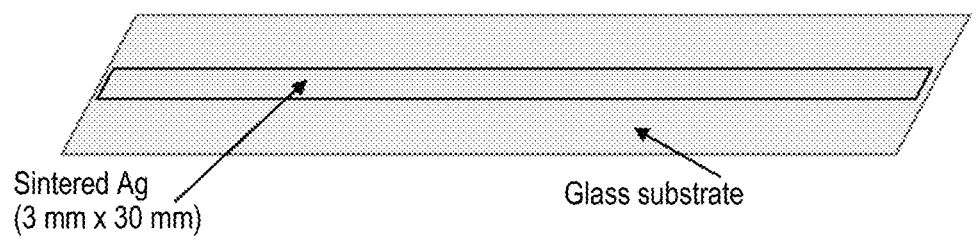
FIG. 2 is a schematic diagram of the wiring used for evaluation of the electric resistance value in Examples.

The electrically conductive paste of each of Examples 3, 10, and 17 and Comparative Example 13 was applied to a glass substrate (thickness of 2 mm) by screen printing using a metal mask (thickness of 100 μm). The glass substrate coated with the electrically conductive paste was heated at 250° C. for 30 minutes in air atmosphere and atmospheric pressure for sintering to form a wiring. The wiring of the sintered body of the electrically conductive paste obtained in this manner had dimensions of 3 mm×30 mm in length× width. A schematic diagram of the obtained wiring is shown in FIG. 2.

The thickness of the wiring of the sintered body obtained in this way for each of Examples 3, 10, and 17 and Comparative Example 13 was measured using a standard outside micrometer M110 (manufactured by Mitutoyo Corporation) under the conditions of room temperature (25° C.) and relative humidity of 50%. Then, the electric resistance value (μΩ·cm) of the wiring for each of Examples 3, 10, and 17 and Comparative Example 13 was measured by the four-terminal method using lozesta-GP MCP-T610 (manufactured by Mitsubishi Chemical Corporation) under the conditions of room temperature (25° C.) and relative humidity of 50%. An ESP probe (MCP-TP08P, No. 014052B, manufactured by Mitsubishi Chemical Corporation) was used as a four-terminal probe for measuring the electric resistance value. The average value of electric resistance values (μΩ·cm) was calculated from three measurements for each wiring.

It can be said that the electrical conductivity is good if the average value of electric resistance values of the wiring is 8.5 μΩ·cm or less.

2. Silver Powder

Figure 3A:
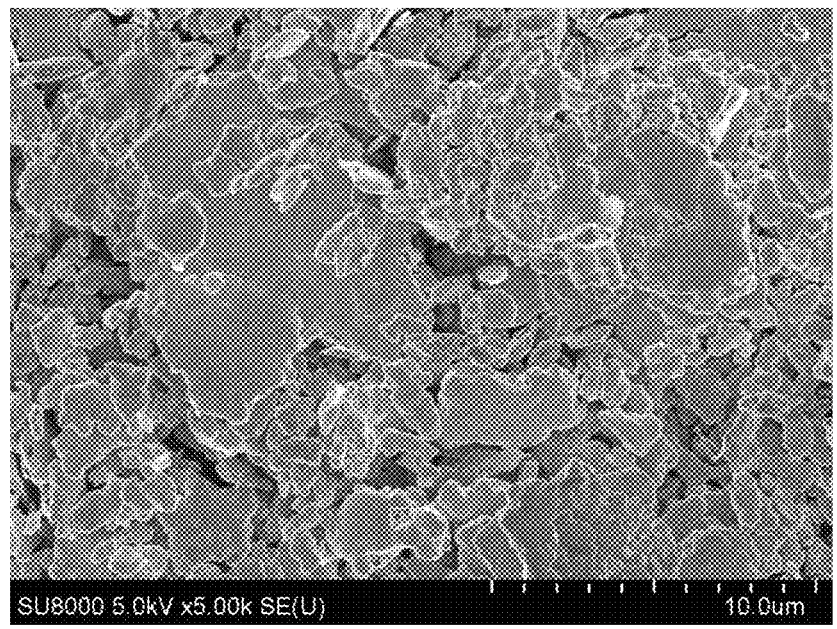
FIG. 3A is an image of the surface of silver powder (A) in Examples taken by a scanning electron microscope (magnification: 5000 times).

As the flake-like silver powder, a commercially available product name AgC239 (manufactured by Fukuda Metal Foil & Powder Co., Ltd., particle size range: 1 μm or more and 15 μm or less, median diameter D50: 2.5 μm, flake-like) (hereinafter referred to as "silver powder (A)") was used. FIG. 3A shows an image of silver powder (A) taken by a field emission scanning electron microscope (FE-SEM) (JSM-7000F manufactured by JEOL Ltd.). FIG. 3A shows the surface of silver powder (A) taken at a magnification of 5000 times.

A non-flake-like silver powder having a particle size in the range of 1 μm or more and 15 μm or less and having a median diameter D50 of 2 μm or more and 5 μm or less (hereinafter referred to as "silver powder (A')"), a silver powder having a particle size in the range of 25 μm or more and 100 μm or less and having a median diameter D50 of 30 μm or more and 40 μm or less (hereinafter referred to as "silver powder (B)"), a silver powder having a particle size in the range of less than 25 μm and having a median diameter D50 of less than 30 μm (hereinafter referred to as "silver powder (B')"), a spherical silver powder having a bimodal particle size distribution (hereinafter referred to as "silver powder (D)"), and a silver powder having a particle size in the range of 10 nm or more and 190 nm or less and having a median diameter D50 of 50 nm or more and 150 nm or less (hereinafter referred to as "silver powder (C)") were prepared by the following procedure.

Manufacture of Silver Powder (A')

Silver powder (A') was produced by the following manufacturing method.

First, 1 g of commercially available silver powder S211A-10 (manufactured by Daiken Kagaku Kogyo Co., Ltd., median diameter D50: 0.54 μm, spherical (non-true sphere)) and 1 g of polyvinylpyrrolidone were dispersed in 150 g of ethylene glycol. The obtained dispersion was heated to 150° C. (reaction temperature), and then 20 g of ethylene glycol solution (containing 5 g of silver nitrate) was added and mixed. The obtained mixed solution was reacted for 3 hours while maintaining the temperature at 150° C. and stirring at a rotation speed of 500 rpm. The obtained reaction solution was cooled to room temperature, and the precipitate (including silver powder) contained in the cooled reaction solution was separated by a centrifuge. The separated precipitate was washed 3 times with ethanol to obtain silver powder (A').

Manufacture of Silver Powder (B)

Spherical silver powder (silver powder (B)) having a particle size within the range of 25 μm or more and 100 μm or less and a median diameter D50 of 36.34 μm was produced by a method of heating silver to a molten state and then spraying and cooling the molten silver (melt spray method).

Manufacture of Silver Powder (B')

Spherical silver powder having a particle size within the range of less than 25 μm and a median diameter D50 of 13.67 μm (silver powder (B')) was produced by a method of heating silver to a molten state and then spraying and cooling the molten silver (melt spray method).

Figure 3B:
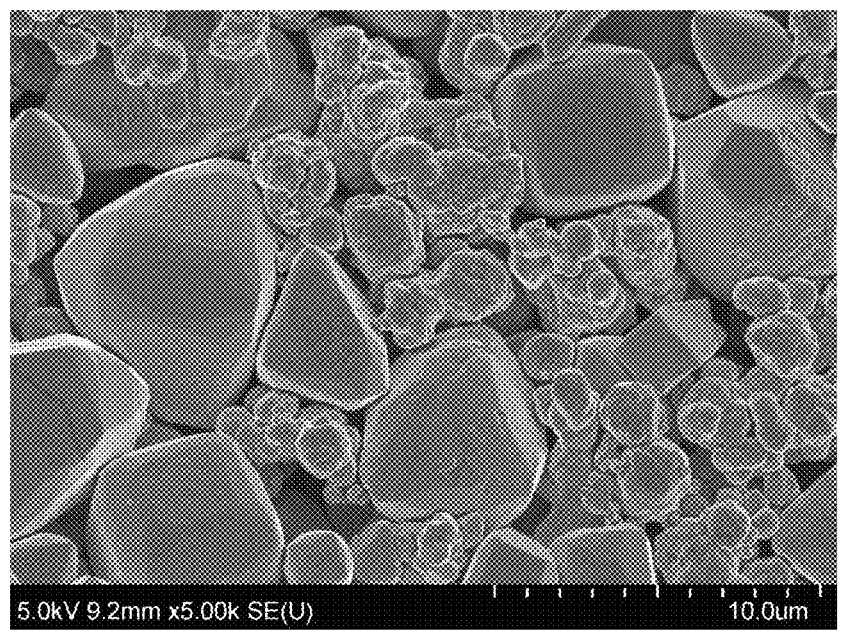
FIG. 3B is an image of the surface of silver powder (A') in Comparative Examples taken by a scanning electron microscope (magnification: 5000 times).
Figure 4:
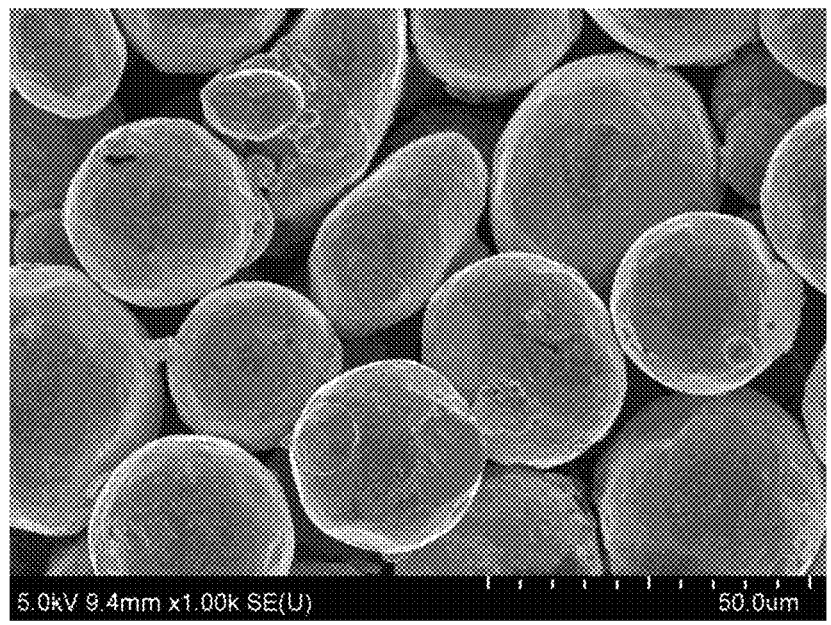
FIG. 4 is an image of the surface of silver powder (B) in Examples taken by a scanning electron microscope (magnification: 1000 times).

FIGS. 3B and 4 show images of the obtained silver powders (A') and (B) taken by a field emission scanning electron microscope (FE-SEM) (JSM-7000F manufactured by JEOL Ltd.), respectively. FIG. 3B shows the surface of silver powder (A') taken at a magnification of 5000 times, and FIG. 4 shows the surface of silver powder (B) taken at a magnification of 1000 times.

Manufacture of Silver Powder (D)

A spherical silver powder (silver powder (D)) having a bimodal particle size distribution with a peak (first peak) having a particle size in the range of 200 nm or more and 800 nm or less and having a median diameter D50 of 300 nm or more and 600 nm or less, and a peak (second peak) having a particle size of 1 μm or more and 15 μm or less and having a median diameter D50 of 1.5 μm or more and 4 μm or less was produced by the following manufacturing method.

1.0 g of silver nitrate (silver compound) was dissolved in 50 g of ethylene glycol (polyhydric alcohol), and then 0.5 g of polyvinylpyrrolidone (dispersing agent) was further dispersed in the ethylene glycol. Then, after heating the obtained ethylene glycol solution to 150° C. (reaction temperature), the reaction was carried out for 1 hour while maintaining the temperature of 150° C. and stirring at a rotation speed of 500 rpm. The silver powder contained in the obtained reaction solution was separated from ethylene glycol (polyhydric alcohol) using a metal mesh, and the separated silver powder was washed with ethanol to obtain silver powder (I).

Then, while stirring 50 g of ethylene glycol at a rotation speed of 500 rpm, 2.0 g of silver nitrate was dissolved in the ethylene glycol, and then 0.05 g of the silver powder (I) was further dispersed in the ethylene glycol. The obtained ethylene glycol solution was heated to 150° C. (reaction temperature), and then the reaction was carried out for 1 hour while maintaining the reaction temperature at 150° C. and stirring at a rotation speed of 500 rpm. The silver powder contained in the obtained reaction solution was separated from ethylene glycol using a metal mesh, and the separated silver powder was washed with ethanol to obtain silver powder (D).

Figure 5:
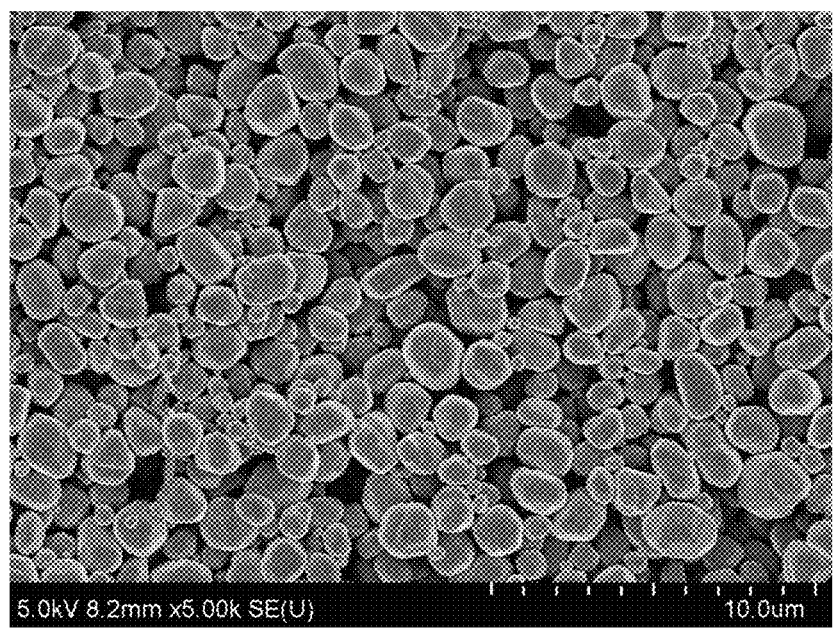
FIG. 5 is an image of the surface of silver powder (D) in Examples taken by a scanning electron microscope (magnification: 5000 times).

FIG. 5 shows an image of the obtained silver powder (D) taken by a field emission scanning electron microscope (FE-SEM) (JSM-7000F manufactured by JEOL Ltd.) FIG. 5 shows the surface of silver powder (D) taken at a magnification of 5000 times. The contents of the first peak and the second peak based on 100 parts by mass of silver powder (D) are about 20 parts by mass and about 80 parts by mass, respectively.

Manufacture of Silver Powder (C)

Silver powder (C) was produced by the following manufacturing method.

First, 0.25 g of polyvinylpyrrolidone (PVP), 100 g of pure water, 1.1 g of silver nitrate, and 150 g of N, N-dimethylformamide (DMF) were placed in a reaction vessel and mixed. After raising the temperature of the obtained mixed solution to 100° C., the reaction was carried out for 1 hour while maintaining the temperature at 100° C. and stirring at a rotation speed of 400 rpm. The obtained reaction solution was cooled to room temperature, and the precipitate (including silver powder) contained in the cooled reaction solution was separated by a centrifuge. The separated precipitate was washed 3 times with ethanol to obtain silver powder (C).

Figure 6A:
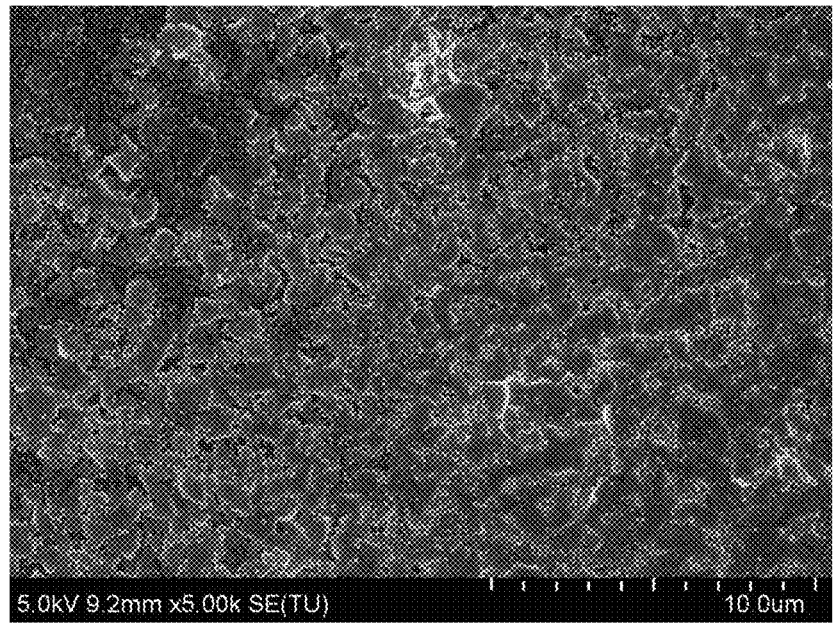
FIG. 6A is an image of the surface of silver powder (C) in Examples taken by a scanning electron microscope (magnification: 5000 times).
Figure 6B:
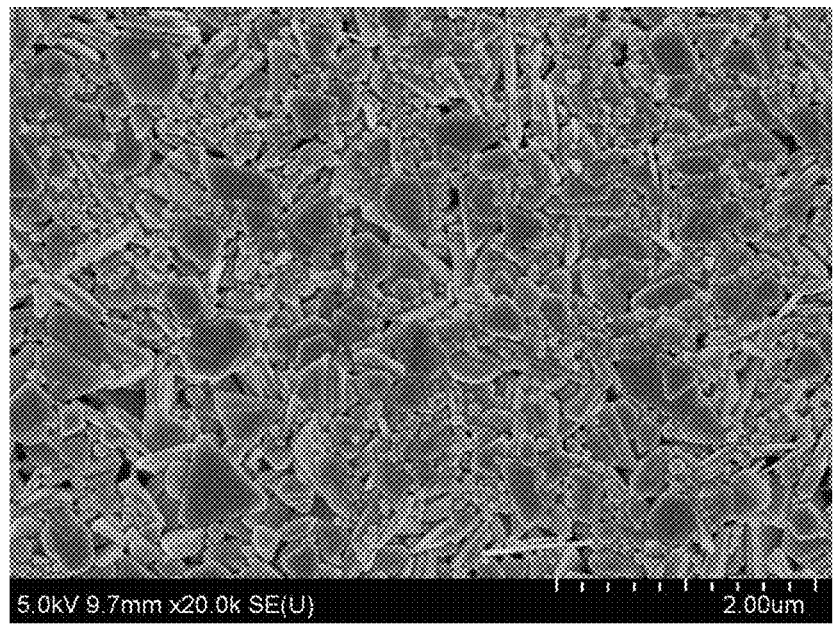
FIG. 6B is an image of the surface of silver powder (C) in Examples taken by a scanning electron microscope (magnification: 20000 times).

FIGS. 6A and 6B show images of the obtained silver powder (C) taken by a field emission scanning electron microscope (FE-SEM) (JSM-7000F manufactured by JEOL Ltd.). FIGS. 6A and 6B show images of the surface of silver powder (C) taken at a magnification of 5000 times and 20000 times, respectively.

Figure 7:
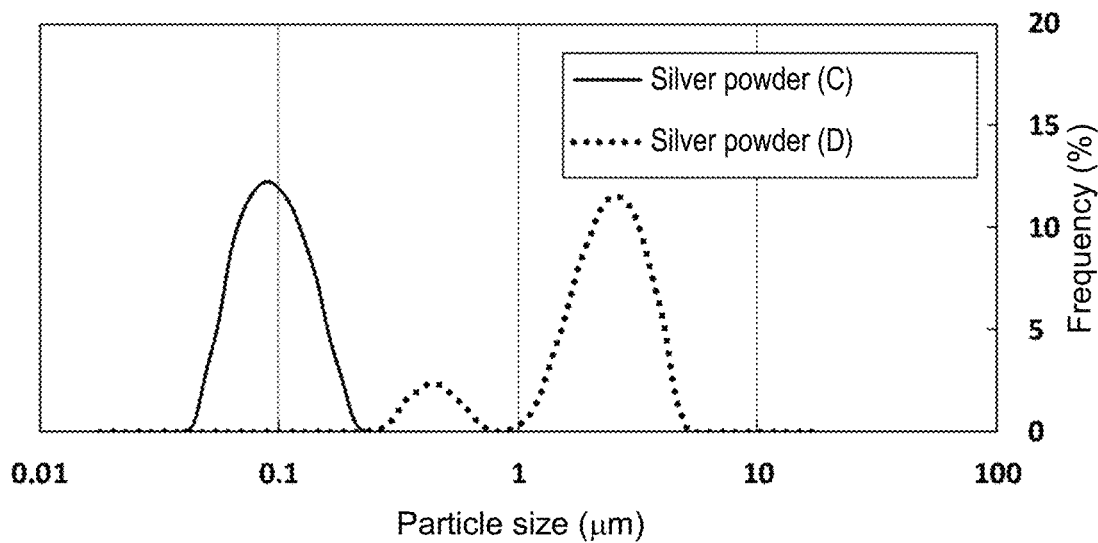
FIG. 7 is a measurement result of the particle size distribution of silver powders (C) and (D) in Examples.

FIG. 7 shows the particle size distributions of silver powders (C) and (D) measured by a laser diffraction method using SALD-2300 (manufactured by Shimadzu Corporation) under the following conditions.

(Measurement Conditions)

First, 0.1 g of silver powder is dissolved in 10 ml of ethanol, and then measurement is performed while dispersing with ultrasonic waves. The particle size distribution is obtained by analyzing the obtained measurement results with the software WingSALDII (manufactured by Shimadzu Corporation).

The particle size range and median diameter D50 of silver powders (A), (A'), (B), (B'), (D), and (C) used in Examples and Comparative Examples mean those measured by a laser diffraction method based on the following conditions using SALD-2300 (manufactured by Shimadzu Corporation).

(Measurement Conditions)

First, 0.1 g of silver powder is dissolved in 10 ml of ethanol, and then measurement is performed while dispersing with ultrasonic waves. The particle size range and median diameter D50 are obtained by analyzing the obtained measurement results with the software WingSALDII (manufactured by Shimadzu Corporation).

3. Manufacture of Electrically Conductive Paste

The electrically conductive pastes of Examples 1 to 33 and Comparative Examples 1 to 23 were prepared with the compositions shown in Tables 1 to 8 below.

The numerical values of each component in Tables 1 to 8 below represent the mass part of each component based on 100 parts by mass, when the total of silver powder is 100 parts by mass.

(1) Examples 1 to 21 and Comparative Examples 1 to 23

The above shear strength was evaluated for each of the electrically conductive pastes of Examples 1 to 21 and Comparative Examples 1 to 23. The evaluation results are shown in Tables 1 to 6 below.

[Table 1]

TABLE 1

|  | Silver powder | | | Solvent Ethylene | % by mass based on the total amount of (A), (B), and (C) | | | Shear strength |
|  | (A) | (B) | (C) | glycol | (A) | (B) | (C) | (MPa) |
| --- | --- | --- | --- | --- | --- | --- | --- | --- |
| Example 1 | 45.0 | 45.0 | 10.0 | 5.0 | 45.0% | 45.0% | 10.0% | 17.6 |
| Example 2 | 40.0 | 40.0 | 20.0 | 5.0 | 40.0% | 40.0% | 20.0% | 23.8 |
| Example 3 | 37.5 | 37.5 | 25.0 | 5.0 | 37.5% | 37.5% | 25.0% | 32.3 |
| Example 4 | 35.0 | 35.0 | 30.0 | 5.0 | 35.0% | 35.0% | 30.0% | 33.4 |
| Example 5 | 25.0 | 25.0 | 50.0 | 5.0 | 25.0% | 25.0% | 50.0% | 34.6 |
| Example 6 | 17.5 | 17.5 | 65.0 | 5.0 | 17.5% | 17.5% | 65.0% | 28.1 |
| Example 7 | 10.0 | 10.0 | 80.0 | 5.0 | 10.0% | 10.0% | 80.0% | 18.3 |

[Table 2]

TABLE 2

| | Silver powder | | | Solvent Ethylene glycol | % by mass based on the total amount of (A), (D), and (C) | | | Shear strength (MPa) |
|---|---|---|---|---|---|---|---|---|
| | (A) | (D) | (C) | | (A) | (D) | (C) | |
| Example 8 | 45.0 | 45.0 | 10.0 | 5.0 | 45.0% | 45.0% | 10.0% | 12.1 |
| Example 9 | 40.0 | 40.0 | 20.0 | 5.0 | 40.0% | 40.0% | 20.0% | 20.1 |
| Example 10 | 37.5 | 37.5 | 25.0 | 5.0 | 37.5% | 37.5% | 25.0% | 33.1 |
| Example 12 | 35.0 | 35.0 | 30.0 | 5.0 | 35.0% | 35.0% | 30.0% | 34.3 |
| Example 13 | 25.0 | 25.0 | 50.0 | 5.0 | 25.0% | 25.0% | 50.0% | 34.2 |
| Example 14 | 17.5 | 17.5 | 65.0 | 5.0 | 17.5% | 17.5% | 65.0% | 30.1 |
| Example 15 | 10.0 | 10.0 | 80.0 | 5.0 | 10.0% | 10.0% | 80.0% | 19.2 |

[Table 3]

TABLE 3

| | Silver powder | | | | Solvent Ethylene glycol | % by mass based on the total amount of (A) to (D) | | | | Shear strength (MPa) |
|---|---|---|---|---|---|---|---|---|---|---|
| | (A) | (B) | (D) | (C) | | (A) | (B) | (D) | (C) | |
| Example 15 | 22.5 | 45.0 | 22.5 | 10.0 | 5.0 | 22.5% | 45.0% | 22.5% | 10.0% | 21.0 |
| Example 16 | 20.0 | 40.0 | 20.0 | 20.0 | 5.0 | 20.0% | 40.0% | 20.0% | 20.0% | 28.9 |
| Example 17 | 18.75 | 37.5 | 18.75 | 25.0 | 5.0 | 18.75% | 37.5% | 18.75% | 25.0% | 35.0 |
| Example 18 | 17.5 | 35.0 | 17.5 | 30.0 | 5.0 | 17.5% | 35.0% | 17.5% | 30.0% | 35.4 |
| Example 19 | 12.5 | 25.0 | 12.5 | 50.0 | 5.0 | 12.5% | 25.0% | 12.5% | 50.0% | 35.5 |
| Example 20 | 8.75 | 17.5 | 8.75 | 65.0 | 5.0 | 8.75% | 17.5% | 8.75% | 65.0% | 33.6 |
| Example 21 | 5.0 | 10.0 | 5.0 | 80.0 | 5.0 | 5.0% | 10.0% | 5.0% | 80.0% | 21.0 |

[Table 4]

TABLE 4

| | Silver powder | | | | Solvent Ethylene glycol | Shear strength (MPa) |
|---|---|---|---|---|---|---|
| | (A) | (B) | (D) | (C) | | |
| Comparative Example 1 | 100.0 | | | | 10.0 | 5.0 or less |
| Comparative Example 2 | | 100.0 | | | 10.0 | 5.0 or less |
| Comparative Example 3 | | | 100.0 | | 6.0 | 5.0 or less |
| Comparative Example 4 | | | | 100.0 | 5.0 | 5.0 or less |

[Table 5]

TABLE 5

| | Silver powder | | | | | | Solvent Ethylene glycol | Ethanol | Shear Strength (MPa) |
|---|---|---|---|---|---|---|---|---|---|
| | (A) | (A') | (B) | (B') | (D) | (C) | | | |
| Comparative Example 5 | 66.7 | | | | 33.3 | | 7.0 | | 5.0 or less |
| Comparative Example 6 | 50.0 | | | | 50.0 | | 8.0 | | 5.0 or less |
| Comparative Example 7 | 50.0 | | | | 50.0 | | | 10.0 | 5.0 or less |
| Comparative Example 8 | | | 56.5 | | 43.5 | | 8.0 | | 5.0 or less |
| Comparative Example 9 | | | 70.0 | | | 30.0 | 5.0 | | 5.0 or less |
| Comparative Example 10 | | | | 50.0 | 50.0 | | 5.0 | | 5.0 or less |

TABLE 5-continued

| | Silver powder | | | | | | Solvent Ethylene glycol | Ethanol | Shear Strength (MPa) |
|---|---|---|---|---|---|---|---|---|---|
| | (A) | (A') | (B) | (B') | (D) | (C) | | | |
| Comparative Example 11 | | | | 35.0 | | 65.0 | 5.0 | | 5.0 or less |
| Comparative Example 12 | 44.6 | | 10.8 | | | 44.6 | 8.0 | | 5.0 or less |
| Comparative Example 13 | 27.5 | | 27.5 | | | 45.0 | 5.0 | | 5.0 or less |
| Comparative Example 14 | 10.5 | | 79.0 | | | 10.5 | 5.0 | | 5.0 or less |
| Comparative Example 15 | 3.0 | | 94.0 | | | 3.0 | 10.0 | | 5.0 or less |
| Comparative Example 16 | | 35.0 | | | 35.0 | | 30.0 | 5.0 | 6.0 |
| Comparative Example 17 | 70.0 | | | | | 30.0 | 5.0 | | 9.8 |

TABLE 6

| | Silver powder | | | | Solvent Ethylene glycol | % by mass based on the total amount of (A), (B), and (C) | | | % by mass based on the total amount of (A), (D), and (C) | | | % by mass based on the total amount of (A) to (D) | | | | Shear strength (MPa) |
|---|---|---|---|---|---|---|---|---|---|---|---|---|---|---|---|---|
| | (A) | (B) | (D) | (C) | | (A) | (B) | (C) | (A) | (D) | (C) | (A) | (B) | (D) | (C) | |
| Comparative Example 18 | 47.5 | 47.5 | | 5.0 | 5.0 | 47.5% | 47.5% | 5.0% | | | | | | | | 11.0 |
| Comparative Example 19 | 5.0 | 5.0 | | 90.0 | 5.0 | 5.0% | 5.0% | 90.0% | | | | | | | | 9.3 |
| Comparative Example 20 | 47.5 | | 47.5 | 5.0 | 5.0 | | | | 47.5% | 47.5% | 5.0% | | | | | 5.8 |
| Comparative Example 21 | 5.0 | | 5.0 | 90.0 | 5.0 | | | | 5.0% | 5.0% | 90.0% | | | | | 8.1 |
| Comparative Example 22 | 26.0 | 26.0 | 43.0 | 5.0 | 5.0 | | | | | | | 26.0% | 26.0% | 43.0% | 5.0% | 5.0 or less |
| Comparative Example 23 | 2.5 | 5.0 | 2.5 | 90.0 | 5.0 | | | | | | | 2.5% | 5.0% | 2.5% | 90.0% | 9.3 |

[Table 6]

The electrically conductive pastes of Examples 1 to 7 shown in Table 1 contain flake-like silver powder A having a particle size in the range of 1 μm or more and 15 μm or less and having a median diameter D50 of 2 μm or more and 5 μm or less, silver powder B having a particle size in the range of 25 μm or more and 100 μm or less and having a median diameter D50 of 30 μm or more and 40 μm or less, silver powder C having a particle size in the range of 10 nm or more and 190 nm or less and having a median diameter D50 of 50 nm or more and 150 nm or less, and a solvent, and the content of silver powder C is more than 5.0 parts by mass and less than 90.0 parts by mass based on 100 parts by mass in total of flake-like silver powder A, silver powder B, and silver powder C.

From the results in Table 1 above, it was found that the sintered bodies of the electrically conductive pastes of Examples 1 to 7 had excellent shear strength and good bondability.

Among them, it was found that the sintered bodies of Examples 2 to 6 showed a shear strength of 23.81 MPa or more and had better bondability. Examples 2 to 6 are electrically conductive pastes in which the content of silver powder C is 20.0 parts by mass or more and 65.0 parts by mass or less based on 100 parts by mass in total of flake-like silver powder A, silver powder B, and silver powder C.

The electrically conductive pastes of Examples 8 to 14 shown in Table 2 contain flake-like silver powder A, spherical silver powder D having a bimodal particle size distribution with a peak having a particle size in the range of 200 nm or more and 800 nm or less and a median diameter D50 of 300 nm or more and 600 nm or less, and a peak having a particle size in the range of 1 μm or more and 15 μm or less and a median diameter D50 of 1.5 μm or more and 4 μm or less, silver powder C, and a solvent, and the content of silver powder C is more than 5.0 parts by mass and less than 90.0 parts by mass based on 100 parts by mass in total of flake-like silver powder A, spherical silver powder D and silver powder C.

From the results in Table 2 above, it was found that the sintered body of the electrically conductive pastes of Examples 8 to 14 had excellent shear strength and good bondability.

Among them, it was found that the sintered bodies of Examples 10 to 13 showed a shear strength of 30.1 MPa or more and had better bondability. Examples 10 to 13 are electrically conductive pastes in which the content of silver powder C is 25.0 parts by mass or more and 65.0 parts by mass or less based on 100 parts by mass in total of flake-like silver powder A, spherical silver powder D, and silver powder C.

The electrically conductive pastes of Examples 15 to 21 shown in Table 3 contain flake-like silver powder A, silver powder B, spherical silver powder D, silver powder C, and a solvent, and the content of silver powder C is more than 5.0 parts by mass and less than 90.0 parts by mass based on 100 parts by mass in total of flake-like silver powder A, silver powder B, spherical silver powder D, and silver powder C.

From the results in Table 3 above, it was found that the sintered bodies of the electrically conductive pastes of Examples 15 to 21 had excellent shear strength and good bondability.

Among them, it was found that the sintered bodies of Examples 16 to 20 showed a shear strength of 28.9 MPa or more and had better bondability. Examples 16 to 20 are electrically conductive pastes in which the content of silver powder C was 20.0 parts by mass or more and 65.0 parts by mass or less based on 100 parts by mass in total of flake-like silver powder A, silver powder B, spherical silver powder D, and silver powder C.

On the other hand, Comparative Examples 1 to 4 shown in Table 4 are electrically conductive pastes containing only one of flake-like silver powder A, silver powder B, spherical silver powder D, and silver powder C.

Comparative Examples 5 to 7 and 12 to 15 shown in Table 5 are electrically conductive pastes containing flake-like silver powder A but not containing silver powder C.

Comparative Example 8 shown in Table 5 is an electrically conductive paste containing neither flake-like silver powder A nor containing silver powder C.

Comparative Examples 9 to 11 and 16 shown in Table 5 are electrically conductive pastes containing silver powder C but not flake-like silver powder A. In addition, Comparative Examples 9 to 11 include not silver powder B but silver powder (silver powder (B')) having a median diameter D50 of less than 30 μm. Comparative Example 16 contains non-flake-like silver powder (silver powder (A')) instead of flake-like silver powder A.

Comparative Example 17 shown in Table 5 is an electrically conductive paste containing flake-like silver powder A and silver powder C but not containing silver powder B and spherical silver powder D.

From the results in Tables 4 and 5 above, in the electrically conductive pastes of Comparative Examples 1 to 17, the shear strength of the sintered body was low and the bondability was inferior.

Comparative Examples 18 and 19 shown in Table 6 are electrically conductive pastes containing flake-like silver powder A, silver powder B, and silver powder C, but the content of silver powder C is 5.0 parts by mass or less or 90.0 parts by mass or more.

Comparative Examples 20 and 21 shown in Table 6 are electrically conductive pastes containing flake-like silver powder A, spherical silver powder D, and silver powder C, but the content of silver powder C is 5.0 parts by mass or less or 90.0 parts by mass or more.

Comparative Examples 22 and 23 shown in Table 6 are electrically conductive pastes containing flake-like silver powder A, silver powder B, spherical silver powder D, and silver powder C, but the content of silver powder C is 5.0 parts by mass or less or 90.0 parts by mass or more.

As can be seen from the results in Table 6 above, the electrically conductive pastes of Comparative Examples 18 to 23 had lower shear strength of the sintered body and were inferior in bondability as compared with the electrically conductive pastes of Examples 1 to 21.

Figure 8:
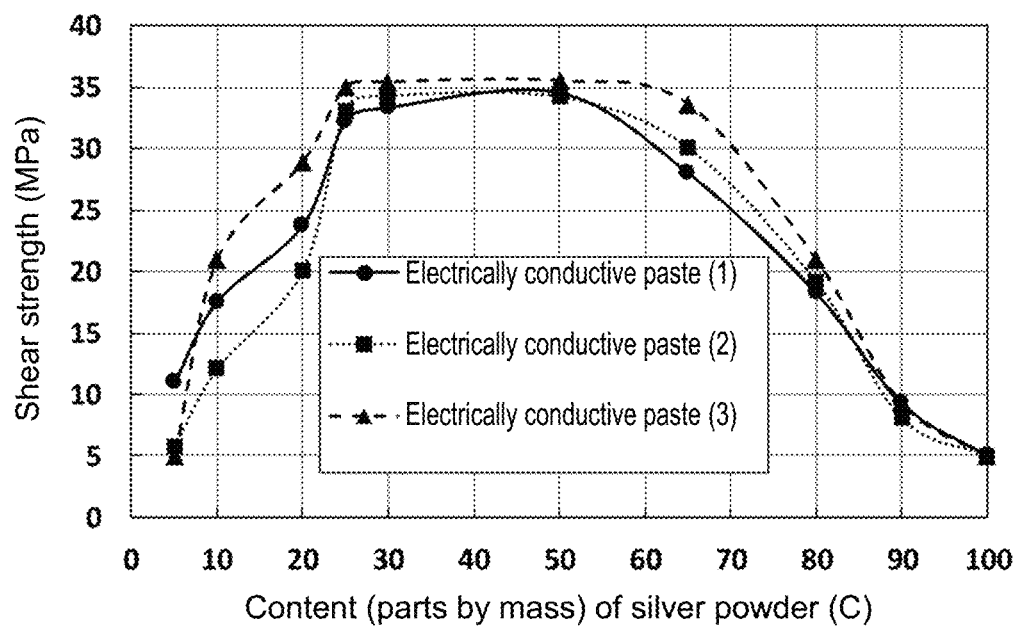
FIG. 8 is a graph of shear strength of the electrically conductive pastes (1) to (3) in Examples (Examples 1 to 21 and Comparative Examples 18 to 23).

FIG. 8 shows graphs of experimental data of shear strength with respect to Examples 1 to 7 and Comparative Examples 18 and 19 relating to an electrically conductive paste containing flake-like silver powder A, silver powder B, silver powder C, and a solvent (hereinafter referred to as "electrically conductive paste (1)"), Examples 8 to 14 and Comparative Examples 20 and 21 relating to an electrically conductive paste containing flake-like silver powder A, spherical silver powder D, silver powder C, and a solvent (hereinafter referred to as "electrically conductive paste (2)"), and Examples 15 to 21 and Comparative Examples 22 and 23 relating to an electrically conductive paste containing flake-like silver powder A, silver powder B, and spherical silver powder D, silver powder C, and a solvent (hereinafter referred to as "electrically conductive paste (3)").

(2) Examples 22 to 24

The above shear strength was evaluated for each of the electrically conductive pastes of Examples 22 to 24. The evaluation results are shown in Table 7 below.

[Table 7]

TABLE 7

|  | Silver powder | | | Solvent Ethylene | % by mass based on the total amount of (A), (B), and (C) | | | Shear strength |
| --- | --- | --- | --- | --- | --- | --- | --- | --- |
|  | (A) | (B) | (C) | glycol | (A) | (B) | (C) | (MPa) |
| Example 22 | 37.5 | 37.5 | 25.0 | 5.0 | 37.5% | 37.5% | 25.0% | 39.0 |
| Example 23 | 37.5 | 37.5 | 25.0 | 5.0 | 37.5% | 37.5% | 25.0% | 33.2 |
| Example 24 | 37.5 | 37.5 | 25.0 | 5.0 | 37.5% | 37.5% | 25.0% | 74.6 |

Example 22: test piece (1') is used?
Example 23: sintered in air atmosphere
Example 24: test piece (1') is used, and sintered in air atmosphere The electrically conductive pastes of Examples 22 to 24 shown in Table 7 have the same composition as the electrically conductive paste of Example 3.

As shown in "(1) Evaluation of shear strength" of the above "1. Evaluation method", Example 22 uses test piece (1') instead of test piece (1). In Example 23, as the atmospheric conditions during sintering, air atmosphere was adopted instead of nitrogen atmosphere. In Example 24, test piece (1') was used instead of test piece (1), and air atmosphere was adopted instead of nitrogen atmosphere as the atmospheric conditions during sintering.

From the comparison between Example 3 in Table 1 above and Examples 22 to 24 in Table 7 above, it was found that the sintered body showed even better shear strength and had better bondability when a copper substrate having an Ag layer (test piece (1')) was used instead of a copper substrate having no Ag layer as a plating layer and having a condition that copper oxide on the surface removed (test piece (1)), and when air atmosphere are used instead of nitrogen atmosphere as the atmospheric conditions during sintering. Among them, in Example 24, in particular, in which test piece (1') was used and air atmosphere was used as the atmospheric conditions during sintering, it was found that the sintered body showed outstandingly excellent shear strength and extremely good bondability.

From the above, it was found that the electrically conductive paste of the present invention, which showed excellent shear strength when a copper substrate having no Ag layer as a plating layer was used and nitrogen atmosphere was used as the atmospheric conditions during sintering, showed the same or better shear strength even when a copper substrate with an Ag layer was used or when air atmosphere was used as the atmospheric conditions during sintering.

(3) Examples 25 to 33

The above shear strength was evaluated for each of the electrically conductive pastes of Examples 25 to 33. The evaluation results are shown in Table 8 below.
[Table 8]

TABLE 8

| | Silver powder | | | | Solvent Ethylene glycol | Shear strength (MPa) | Sintering temperature (° C.) |
|---|---|---|---|---|---|---|---|
| | (A) | (B) | (D) | (C) | | | |
| Example 25 | 37.5 | 37.5 | | 25.0 | 5.0 | 19.0 | 200 |
| Example 26 | 37.5 | 37.5 | | 25.0 | 5.0 | 42.3 | 280 |
| Example 27 | 37.5 | 37.5 | | 25.0 | 5.0 | 41.2 | 300 |
| Example 28 | 37.5 | | 37.5 | 25.0 | 5.0 | 23.6 | 200 |
| Example 29 | 37.5 | | 37.5 | 25.0 | 5.0 | 41.2 | 280 |
| Example 30 | 37.5 | | 37.5 | 25.0 | 5.0 | 42.0 | 300 |
| Example 31 | 18.75 | 37.5 | 18.75 | 25.0 | 5.0 | 24.3 | 200 |
| Example 32 | 18.75 | 37.5 | 18.75 | 25.0 | 5.0 | 46.3 | 280 |
| Example 33 | 18.75 | 37.5 | 18.75 | 25.0 | 5.0 | 43.5 | 300 |

As shown in "(1) Evaluation of shear strength" of "1. Evaluation method", the electrically conductive pastes of Examples 25 to 33 have the same composition as the electrically conductive pastes of Examples 3, 10 and 17, respectively, and the sintering temperature is 200° C., 280° C., or 300° C. instead of 250° C.

Figure 9:
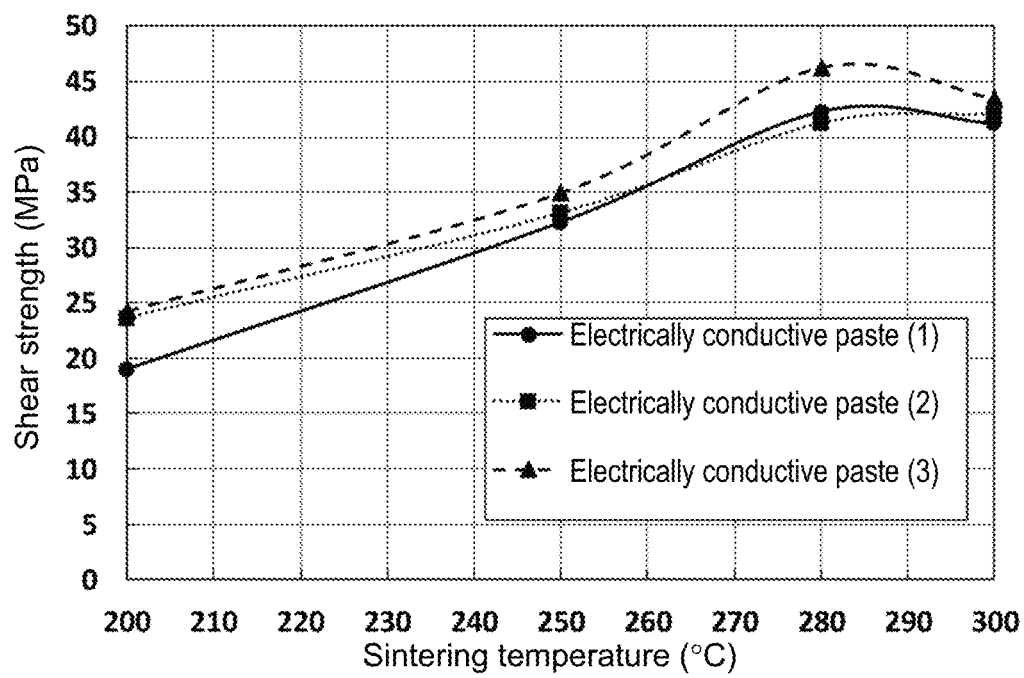
FIG. 9 is a graph showing the shear strength of the electrically conductive pastes (1) to (3) (Examples 3, 10, 17, and 25 to 33) in Examples for each sintering temperature.

FIG. 9 shows a graph relating to the above-mentioned electrically conductive pastes (1) to (3) that is a summary of the measurement results of the shear strengths of Examples 3, 10, 17, and 25 to 33.

From the results of Examples 3, 10, 17, and 25 to 33 shown in Tables 1 to 3 and 8, and FIG. 9, it was found that good shear strength was exhibited at any sintering temperature of 200 to 300° C. In particular, it was confirmed that sintering proceeds even at a low sintering temperature of 200° C. and a sufficient shear strength was exhibited.

(4) Electrical Resistance Value of Wiring of Sintered Body (Examples 3, 10, and 17 and Comparative Example 13)

For Examples 3, 10, and 17, and Comparative Example 13, as shown in "(2) Evaluation of electric resistance value" of the above "1. Evaluation method", the electric resistance value of the wiring of the sintered body was also evaluated. The evaluation results are shown in Table 9 below.
[Table 9]

TABLE 9

| | Thickness of wiring (μm) | Electric resistance value (μΩ · cm) |
|---|---|---|
| Example 3 | 100 | 3.8 |
| Example 10 | 100 | 4.1 |
| Example 17 | 100 | 3.3 |
| Comparative Example 13 | 100 | 10.3 |

From the results in Table 9 above, it was found that the electrically conductive pastes of Examples 3, 10 and 17 had a low electrical resistance value of the wiring of the sintered body and had good conductivity. On the other hand, the electrically conductive paste of Comparative Example 13 had a high electrical resistance value of the wiring of the sintered body and had insufficient conductivity.

(5) Condition of Each Sample

Figure 10A:
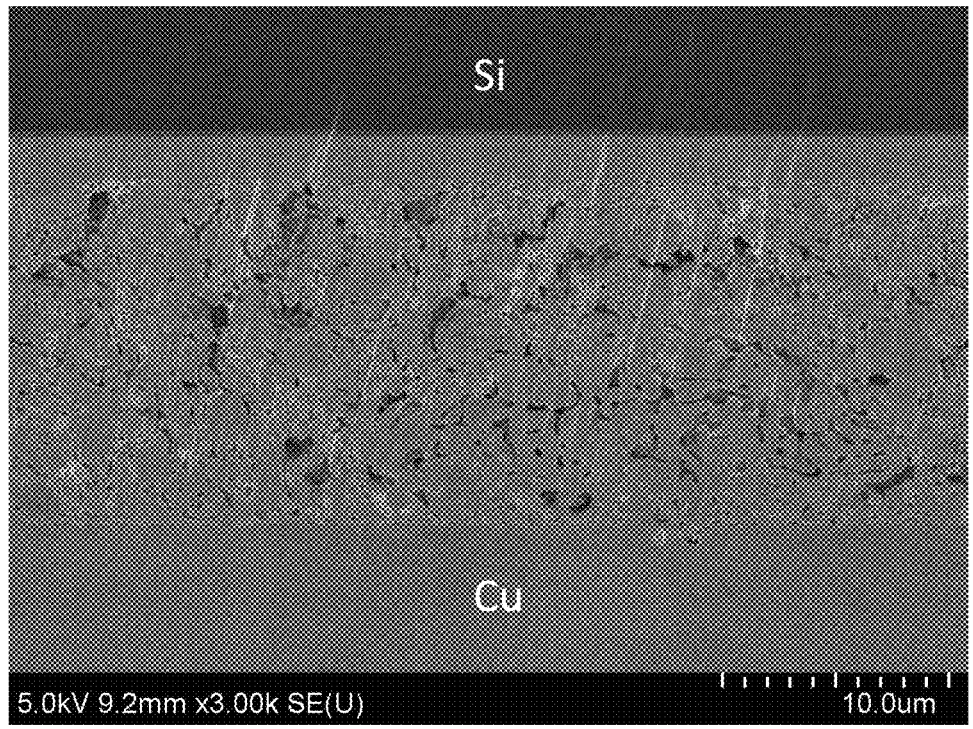
FIG. 10A is an image of the cross section of the sample for measuring shear strength after sintering in Example 11 taken by a scanning electron microscope (magnification: 3000 times).
Figure 10B:
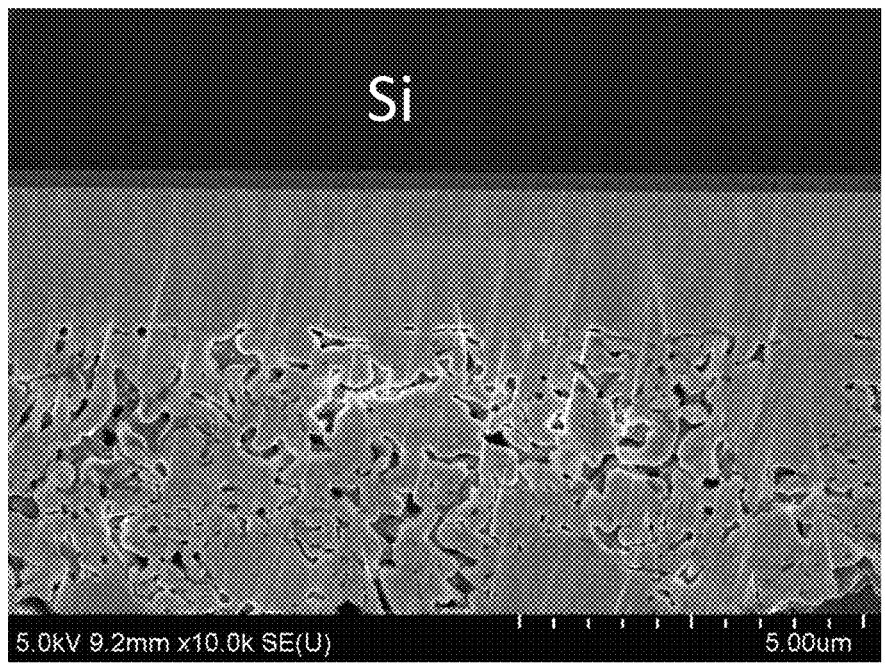
FIG. 10B is an image of the cross section of the sample for measuring shear strength after sintering in Example 11 taken by a scanning electron microscope (magnification: 10000 times).
Figure 10C:
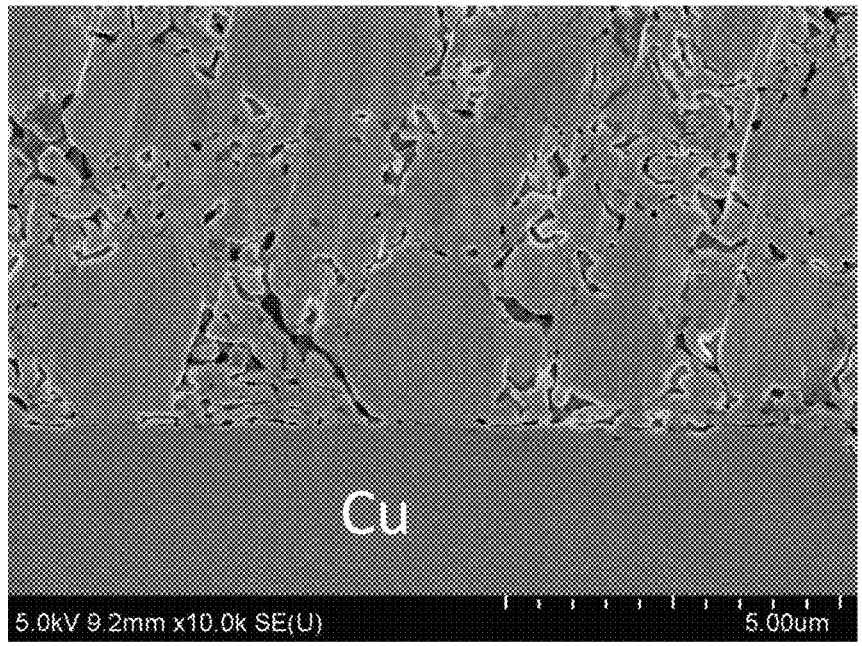
FIG. 10C is an image of the cross section of the sample for measuring shear strength after sintering in Example 11 taken by a scanning electron microscope (magnification: 10000 times).

The images taken by a field emission scanning electron microscope (FE-SEM) (JSM-7000F manufactured by JEOL Ltd.) of the samples for shear strength measurement of Example 11 are shown in FIGS. 10A to 10C.

FIGS. 10A to 10C show the cross section of the sample of Example 11 at magnifications of 3000 times, 10000 times, and 10000 times, respectively.

From FIGS. 10A to 10C, it was confirmed that the silver particles were sufficiently contacted and fused with each other to obtain a good sintered body, and that the sintered body sufficiently bonded the Si chip and the copper substrate.

Figure 11:
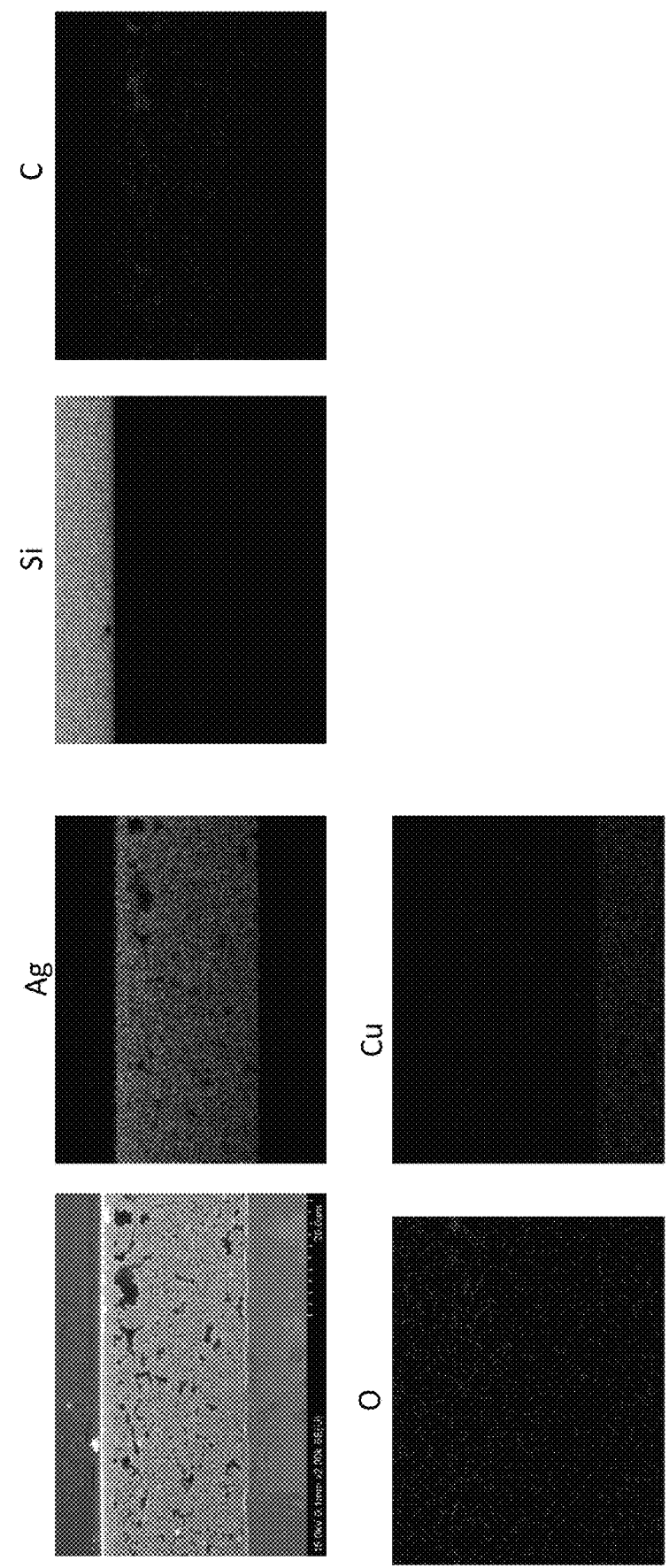
FIG. 11 is an image showing the result of mapping measurement of each element in the cross section of the sample for measuring shear strength after sintering in Example 3.

FIG. 11 shows images of mapping of each element for the sample for shear strength measurement of Example 3 measured under the conditions of an accelerating voltage of 25 kV using SEM energy dispersive X-ray analysis (EDS).

As can be seen from FIG. 11, oxygen atoms were not concentrated at the interface between the copper substrate located at the bottom of FIG. 11 and the sintered body located at the center of FIG. 11, and no copper atom was seen at the interface. From the above, it was confirmed that copper oxide was not formed at the interface and that a strong bond between the copper substrate and the sintered body was realized.

From the above results, it was found that (1) the electrically conductive paste containing flake-like silver powder A, silver powder B, silver powder C, and a solvent, wherein the content of silver powder C is more than 5.0 parts by mass and less than 90.0 parts by mass based on 100 parts by mass in total of flake-like silver powder A, silver powder B, and silver powder C, (2) the electrically conductive paste containing flake-like silver powder A, spherical silver powder D, silver powder C, and solvent, wherein the content of silver powder C is more than 5.0 parts by mass and less than 90.0 parts by mass based on 100 parts by mass in total of flake-like silver powder A, spherical silver powder D, and silver powder C, and (3) the electrically conductive paste containing flake-like silver powder A, silver powder B, spherical silver powder D, silver powder C, and solvent, wherein the content of silver powder C is more than 5.0 parts by mass and less than 90.0 mass based on 100 parts by mass in total of flake-like silver powder A, silver powder B, spherical silver powder D, and silver powder C, show better bondability when applied to a Cu substrate or Cu electrode and sintered.

The invention claimed is:

1. An electrically conductive paste comprising:
a flake-like silver powder A having a particle size in the range of 1 μm or more and 15 μm or less and having a median diameter D50 of 2 μm or more and 5 μm or less;
a silver powder B having a particle size in the range of 25 μm or more and 100 μm or less and having a median diameter D50 of 30 μm or more and 40 μm or less;
a silver powder C having a particle size in the range of 10 nm or more and 190 nm or less and having a median diameter D50 of 50 nm or more and 150 nm or less; and
a solvent,
wherein the content of the silver powder C is more than 5.0 parts by mass and less than 90.0 parts by mass based on 100 parts by mass in total of the flake-like silver powder A, the silver powder B, and the silver powder C.

2. An electrically conductive paste comprising:
a flake-like silver powder A having a particle size in the range of 1 μm or more and 15 μm or less and having a median diameter D50 of 2 μm or more and 5 μm or less;
a spherical silver powder D having a bimodal particle size distribution with a peak having a particle size in the range of 200 nm or more and 800 nm or less and having a median diameter D50 of 300 nm or more and 600 nm or less, and a peak having a particle size in the range of 1 μm or more and 15 μm or less and having a median diameter D50 of 1.5 μm or more and 4 μm or less;
a silver powder C having a particle size in the range of 10 nm or more and 190 nm or less and having a median diameter D50 of 50 nm or more and 150 nm or less; and
a solvent,
wherein the content of the silver powder C is more than 5.0 parts by mass and less than 90.0 parts by mass based on 100 parts by mass in total of the flake-like silver powder A, the spherical silver powder D, and the silver powder C.

3. An electrically conductive paste comprising:
a flake-like silver powder A having a particle size in the range of 1 μm or more and 15 μm or less and having a median diameter D50 of 2 μm or more and 5 μm or less;
a silver powder B having a particle size in the range of 25 μm or more and 100 μm or less and having a median diameter D50 of 30 μm or more and 40 μm or less;
a spherical silver powder D having a bimodal particle size distribution with a peak having a particle size in the range of 200 nm or more and 800 nm or less and having a median diameter D50 of 300 nm or more and 600 nm or less, and a peak having a particle size in the range of 1 μm or more and 15 μm or less and having a median diameter D50 of 1.5 μm or more and 4 μm or less;
a silver powder C having a particle size in the range of 10 nm or more and 190 nm or less and having a median diameter D50 of 50 nm or more and 150 nm or less; and
a solvent,
wherein the content of the silver powder C is more than 5.0 parts by mass and less than 90.0 parts by mass based on 100 parts by mass in total of the flake-like silver powder A, the silver powder B, the spherical silver powder D, and the silver powder C.

4. The electrically conductive paste according to claim 1, wherein the content of the silver powder C is 20.0 parts by mass or more and 65.0 parts by mass or less based on 100 parts by mass in total of the flake-like silver powder A, the silver powder B, and the silver powder C.

5. The electrically conductive paste according to claim 2, wherein the content of the silver powder C is 25.0 parts by mass or more and 65.0 parts by mass or less based on 100 parts by mass in total of the flake-like silver powder A, the spherical silver powder D, and the silver powder C.

6. The electrically conductive paste according to claim 3, wherein the content of the silver powder C is 20.0 parts by mass or more and 65.0 parts by mass or less based on 100 parts by mass in total of the flake-like silver powder A, the silver powder B, the spherical silver powder D, and the silver powder C.

7. A laminated body comprising a Cu substrate or Cu electrode, the electrically conductive paste according to claim 1, and an electrical conductor.

8. A method for bonding a Cu substrate or Cu electrode to an electrical conductor, comprising:
a step of applying the electrically conductive paste according to claim 1 to a Cu substrate or Cu electrode;
a step of laminating an electrical conductor on the electrically conductive paste on the Cu substrate or Cu electrode to form a laminated body comprising the Cu substrate or Cu electrode, the electrically conductive paste, and the electrical conductor; and
a step of sintering the electrically conductive paste by heating the laminated body at a temperature of 150 to 350° C. for a period of 1 minute or more and less than 100 minutes.

9. A laminated body comprising a Cu substrate or Cu electrode, the electrically conductive paste according to claim 2, and an electrical conductor.

10. A laminated body comprising a Cu substrate or Cu electrode, the electrically conductive paste according to claim 3, and an electrical conductor.

11. A method for bonding a Cu substrate or Cu electrode to an electrical conductor, comprising:
a step of applying the electrically conductive paste according to claim 2 to a Cu substrate or Cu electrode;
a step of laminating an electrical conductor on the electrically conductive paste on the Cu substrate or Cu electrode to form a laminated body comprising the Cu substrate or Cu electrode, the electrically conductive paste, and the electrical conductor; and a step of sintering the electrically conductive paste by heating the laminated body at a temperature of 150 to 350° C. for a period of 1 minute or more and less than 100 minutes.

12. A method for bonding a Cu substrate or Cu electrode to an electrical conductor, comprising:
- a step of applying the electrically conductive paste according to claim 3 to a Cu substrate or Cu electrode;
- a step of laminating an electrical conductor on the electrically conductive paste on the Cu substrate or Cu electrode to form a laminated body comprising the Cu substrate or Cu electrode, the electrically conductive paste, and the electrical conductor; and
- a step of sintering the electrically conductive paste by heating the laminated body at a temperature of 150 to 350° C. for a period of 1 minute or more and less than 100 minutes.

* * * * *